United States Patent
Liu et al.

(10) Patent No.: US 7,602,317 B2
(45) Date of Patent: *Oct. 13, 2009

(54) DATA ENCODING AND DECODING USING SLEPIAN-WOLF CODED NESTED QUANTIZATION TO ACHIEVE WYNER-ZIV CODING

(76) Inventors: Zhixin Liu, 2250 Dartmouth St., #413, College Station, TX (US) 77840; Samuel S. Cheng, 1239 Bay Area Blvd., Apt 1002, Houston, TX (US) 77058; Angelos D. Liveris, 1000 Farrah La., Apt 1315, Stafford, TX (US) 77477; Zixiang Xiong, 2323 Ligustrum Flower Dr., Spring, TX (US) 77388

( * ) Notice: Subject to any disclaimer, the term of this patent is extended or adjusted under 35 U.S.C. 154(b) by 0 days.

This patent is subject to a terminal disclaimer.

(21) Appl. No.: 11/868,885

(22) Filed: Oct. 8, 2007

(65) Prior Publication Data
US 2008/0106443 A1    May 8, 2008

Related U.S. Application Data

(60) Division of application No. 11/086,778, filed on Mar. 22, 2005, now Pat. No. 7,295,137, which is a continuation-in-part of application No. 11/068,737, filed on Mar. 1, 2005, now Pat. No. 7,256,716.

(60) Provisional application No. 60/657,520, filed on Mar. 1, 2005.

(51) Int. Cl.
*H03M 7/34* (2006.01)

(52) U.S. Cl. .............................. 341/51; 341/56; 341/57; 341/107; 375/240; 375/340

(58) Field of Classification Search .................. 341/51, 341/56, 67, 107; 375/240, 340
See application file for complete search history.

(56) References Cited

U.S. PATENT DOCUMENTS

| 4,084,137 | A |  | 4/1978 | Welti |  |
|---|---|---|---|---|---|
| 5,586,331 | A |  | 12/1996 | Levenstein |  |
| 6,263,029 | B1 |  | 7/2001 | Alard et al. |  |
| 6,441,764 | B1 | * | 8/2002 | Barron et al. | 341/155 |
| 6,956,508 | B2 |  | 10/2005 | Han et al. |  |
| 7,173,978 | B2 | * | 2/2007 | Zhang et al. | 375/298 |
| 7,187,804 | B2 |  | 3/2007 | Zhao et al. |  |
| 7,295,137 | B2 |  | 11/2007 | Liu et al. |  |
| 7,346,833 | B2 | * | 3/2008 | Hagh et al. | 714/780 |
| 7,400,774 | B2 | * | 7/2008 | Puri et al. | 382/238 |

(Continued)

OTHER PUBLICATIONS

A. Wyner and J. Ziv, "The rate-distortion function for source coding with side information at the decoder," IEEE Trans. Inform. Theory, vol. 22, pp. 1-10, Jan. 1976.

(Continued)

*Primary Examiner*—Linh V Nguyen
(74) *Attorney, Agent, or Firm*—Knobbe, Martens, Olson & Bear LLP

(57) ABSTRACT

A system and method for realizing a Wyner-Ziv encoder may involve the following steps: (a) apply nested quantization to input data from an information source in order to generate intermediate data; and (b) encode the intermediate data using an asymmetric Slepian-Wolf encoder in order to generate compressed output data representing the input data. Similarly, a Wyner-Ziv decoder may be realized by: (1) applying an asymmetric Slepian-Wolf decoder to compressed input data using side information to generate intermediate values, and (b) jointly decoding the intermediate values using the side information to generate decompressed output data.

25 Claims, 14 Drawing Sheets

U.S. PATENT DOCUMENTS

| | | | |
|---|---|---|---|
| 7,420,484 B2* | 9/2008 | Liu et al. | 341/51 |
| 2002/0101915 A1* | 8/2002 | Zhang et al. | 375/222 |
| 2002/0110206 A1 | 8/2002 | Becker et al. | |
| 2002/0176494 A1* | 11/2002 | Zhao et al. | 375/240 |
| 2004/0128592 A1* | 7/2004 | Park | 714/709 |
| 2005/0062623 A1* | 3/2005 | Lee et al. | 341/107 |
| 2006/0048038 A1* | 3/2006 | Yedidia et al. | 714/793 |
| 2007/0013561 A1* | 1/2007 | Xu et al. | 341/50 |

OTHER PUBLICATIONS

A. Wyner, "The rate-distortion function for source coding with side information at the decoder-II: general sources", Inform. Contr., vol. 38, pp. 60-80, 1978.

S. Servetto, "Lattice quantization with side information," Proc. DCC'00, Snowbird, UT, Mar. 2000.

X. Wang and M. Orchard, "Design of trellis codes for source coding with side information at the decoder," Proc. DCC'01, Snowbird, UT, Mar. 2001.

P. Mitran, and J. Bajcsy, "Coding for the Wyner-Ziv problem with turbo-like codes," Proc. ISIT'02, Lausanne, Switzerland, Jun./Jul. 2002.

A. Aaron, R. Zhang and B. Girod, "Wyner-Ziv coding of motion video," Proc. 36th Asilomar Conf., Pacific Grove, CA, Nov. 2002.

S. Pradhan and K. Ramchandran, "Distributed source coding using syndromes (DISCUS): Design and construction," IEEE Trans. Inform. Theory, vol. 49, pp. 626-643, Mar. 2003.

D. Rebollo-Monedero, R. Zhang, and B. Girod, "Design of optimal quantizers for distributed source coding," Proc. IEEE Data Compression Conference, Snowbird, UT, Apr. 2003.

J. Chou, S. Pradhan, and K. Ramchandran, "Turbo and trellis-based constructions for source coding with side information," Proc. DCC'03, Snowbird, UT, Mar. 2003.

A. Liveris, Z. Xiong and C. Georghiades, "Nested convolutional/turbo codes for the binary Wyner-Ziv problem," Proc. ICIP'03, Barcelona, Spain, Sep. 2003.

Z. Xiong, A. Liveris, S. Cheng, and Z. Liu, "Nested quantization and Slepian-Wolf coding: A Wyner-Ziv coding paradigm for i.i.d. sources," Proc. IEEE Workshop on Statistical Signal Processing, St.Louis, MO, Sep. 2003.

Y. Yang, S. Cheng, Z. Xiong, and W. Zhao "Wyner-Ziv coding based on TCQ and LDPC codes," Conference Record of the 37th Asimolar Conference on Signals, Systems and Computers; Nov. 2003; pp. 825-829; vol. 1.

Z. Liu, S. Cheng, A. Liveris, and Z. Xiong, "Slepian-Wolf coded nested quantization (SWC-NQ) for Wyner-Ziv coding: Performance analysis and code design," Data Compression Conference Proceedings; Mar. 2004; pp. 322-331.

G. Ungerboeck; "Channel Coding with Multilevel/Phase Signals", IEEE Transactions on Information Theory; Jan. 1982; pp. 55-67; vol. IT-28, No. 1.

M. Marcellin, T. Fischer, "Trellis Coded Quantization of Memoryless and Gauss-Markov Sources" IEEE Transactions on Communications; Jan. 1990, pp. 82-83; vol. 38, No. 1.

R. Zamir and S. Shamai, "Nested linear/lattice codes for Wyner-Ziv encoding," Proc. IEEE Information Theory Workshop, pp. 92-93, Killarney, Ireland, Jun. 1998.

J. H. Conway, E. M. Rains, and N. J. A. Sloane; "On the Existence of Similar Sublattices"; Canadian Journal of Mathematics; 1999; pp. 1300-1306; vol. 51, No. 6.

R. Zamir, S. Shamai, and U. Erez, "Nested linear/lattice codes for structured multiterminal binning," IEEE Transactions on Information Theory, vol. 48, pp. 1250-1276, Jun. 2002.

M. Vedat Eyuboglu and G. David Forney, Jr.; "Lattice and Trellis Quantizations with Lattice- and Trellis-Bounded Codebooks—High-Rate Theory for Memoryless Sources"; IEEE Transactions on Information Theory; Jan. 1993; pp. 46-59; vol. 39, No. 1.

D. J. C. Mackay; "Good Error-Correcting Codes Based on Very Sparse Matrices" IEEE Transactions on Information Theory; Mar. 1999; pp. 399-431; vol. 45, No. 2.

D. J. C. Mackay and R. M. Neal; "Near Shannon Limit Performance of Low Density Parity Check Codes" Electronics Letters; Mar. 13, 1997; pp. 457-458; vol. 33, No. 6.

D. Rebollo-Monedero, A. Aaron, and B. Girod "Transforms for high-rate distributed source coding," Proc. 37th Asilomar Conf., Pacific Grove, CA, Nov. 2003.

D. Slepian and J.K. Wolf, "Noiseless coding of correlated information sources," IEEE Trans. Inform. Theory, vol. 19, pp. 471-480, Jul. 1973.

R. Zamir; "The Rate Loss in the Wyner-Ziv Problem"; IEEE Transactions on Information Theory; Nov. 1996; pp. 2073-2084; vol. 45, No. 2.

V. Tarokh, A. Vardy, and K. Zeger, "Universal Bound on the performance of lattice codes," IEEE Trans. Inform. Theory, vol. 45, pp. 670-681, Mar. 1999.

Lori A. Dalton, "Analysis of 1-D Nested Lattice Quantization and Slepian-Wolf Coding for Wyner-Ziv Coding of i.i.d. Sources", Project report for ELEN 663, Texas A&M University, May 2003.

G. D. Forney Jr., "Coset codes-Part II: Binary lattices and related codes," IEEE Trans. Inform. Theory, vol. 34, pp. 1152-1187, 1988.

A. Liveris, Z. Xiong and C. Georghiades, "Compression of binary sources with side information at the decoder using LDPC codes," IEEE Communications Letters, vol. 6, pp. 440-442, Oct. 2002.

* cited by examiner

DATA ENCODING AND DECODING USING SLEPIAN-WOLF CODED NESTED QUANTIZATION TO ACHIEVE WYNER-ZIV CODING

PRIORITY DATA AND CONTINUATION DATA

This application is a divisional of U.S. patent application Ser. No. 11/086,778, filed Mar. 22, 2005 now U.S. Pat. No. 7,295,137, entitled "Data Encoding and Decoding Using Slepian-Wolf Coded Nested Quantization to Achieve Wyner-Ziv Coding", invented by Liu, Cheng, Liveris and Xiong, which is a continuation-in-part of U.S. patent application Ser. No. 11/068,737, filed on Mar. 1, 2005, entitled "Data Encoding and Decoding Using Slevian-Wolf Coded Nested Quantization to Achieve Wyner-Ziv Coding", invented by Liu, Cheng, Liveris and Xiong, now U.S. Pat. No. 7,256,716, and which claims the benefit of priority to U.S. Provisional Application No. 60/657,520, filed on Mar. 1, 2005. Application Ser. No. 11/086,778 is hereby incorporated by reference in its entirety. Application Ser. No. 11/068,737 including all its Appendices is hereby incorporated by reference in its entirety. U.S. Provisional Application No. 60/657,520, filed on Mar. 1, 2005 including all its Appendices is hereby incorporated by reference in its entirety.

STATEMENT OF U.S. GOVERNMENT LICENSING RIGHTS

The U.S. Government has a paid-up license in this invention and the right in limited circumstances to require the patent owner to license others on reasonable terms as provided for by the terms of grant number CCR-01-04834 awarded by the National Science Foundation (NSF).

FIELD OF THE INVENTION

The present invention relates to the field of information encoding/decoding, and more particularly to a system and method for realizing a Wyner-Ziv code using nested quantization and Slepian Wolf coding.

DESCRIPTION OF THE RELATED ART

In 1976, Wyner and Ziv [1] established a theorem regarding the best possible source coding performance given distortion under the assumption that the decoder has access to side information. Unfortunately, codes realizing or approaching this best possible performance have not heretofore been demonstrated. Thus, it would be greatly desirable to be able to design codes (especially practical codes) realizing or approaching this best possible performance, and, to deploy such codes for use in encoders and decoders.

SUMMARY

In one set of embodiments, a system and method for generating compressed output data may involve:
 (a) receiving input data from an information source;
 (b) applying nested quantization to the input data in order to generate intermediate data;
 (c) encoding the intermediate data using an asymmetric Slepian-Wolf encoder in order to generate compressed output data representing the input data; and
 (d) performing at least one of storing the compressed output data, and, transferring the compressed output data.

The values of the input data may be interpreted as vectors in an n-dimensional space, where n is greater than or equal to one.

The information source may be a continuous source or a discrete source. A discrete source generates values in a finite set. A continuous source generates values in a continuum.

The operations (b) and (c) may be arranged so as to realize the encoder portion of a Wyner-Ziv code.

The compressed output data may be stored in a memory medium for future decompression. Alternatively, the compressed output data may be transferred to a decoder for more immediate decompression.

The process of applying nested quantization to the input data may include: quantizing values of the input data with respect to a fine lattice to determine corresponding points of the fine lattice; and computing indices identifying cosets of a coarse lattice in the fine lattice corresponding to the fine lattice points. The intermediate data include said indices. The coarse lattice is a sublattice of the fine lattice.

In any given dimension, some choices for the fine lattice and coarse lattice may lead to better performance than others. However, the principles of the present invention may be practiced with non-optimal choices for the fine lattice and coarse lattice as well as with optimal choices.

In another set of embodiments, a system and method for recovering information from compressed input data may involve:
 (a) receiving compressed input data, wherein the compressed input data is a compressed representation of a block of samples of a first source X;
 (b) receiving a block of samples of a second source Y;
 (c) applying an asymmetric Slepian-Wolf decoder to the compressed input data using the block of samples of the second source Y, wherein said applying generates a block of intermediate values;
 (d) performing joint decoding on each intermediate value and a corresponding sample of the block of second source samples to obtain a corresponding decompressed output value.

The operations (c) and (d) may be arranged so as to realize the decoder portion of a Wyner-Ziv code.

The joint decoding may involve determining an estimate of a centroid of a function restricted to a region of space corresponding to the intermediate value. The function may be the conditional probability density function of the first source X given said corresponding sample of the second source block. The centroid estimate may be (or may determine) the decompressed output value.

The region of space is a union of cells (e.g., Voronoi cells) corresponding to a coset of a coarse lattice in a fine lattice, wherein the coset is identified by the intermediate value.

In yet another set of embodiments, a system and method for computing a table representing a nested quantization decoder may involve:
 (a) computing a realization z of a first random vector;
 (b) computing a realization y of a second random vector;
 (c) adding z and y to determine a realization x of a source vector;
 (d) quantizing the realization x to a point in a fine lattice;
 (e) computing an index J identifying a coset of a coarse lattice in the fine lattice based on the fine lattice point;
 (f) adding the realization x to a cumulative sum corresponding to the index J and the realization y;
 (g) incrementing a count value corresponding to the index J and the realization y;
 (h) repeating operations (a) through (g) a number of times;

(i) dividing the cumulative sums by their corresponding count values to obtain resultant values; and (j) storing the resultant values in a memory.

In one set of embodiments, a system for generating compressed output data may include a memory and a processor. The memory is configured to store data and program instructions. The processor is configured to read and execute the program instructions from the memory. In response to execution of the program instructions, the processor is operable to: (a) receive input data from an information source; (b) apply nested quantization to the input data in order to generate intermediate data; (c) encode the intermediate data using an asymmetric Slepian-Wolf encoder in order to generate compressed output data representing the input data; and (d) perform at least one of: storing the compressed output data; and transferring the compressed output data.

In another set of embodiments, a system for decoding compressed data may include a memory and processor. The memory is configured to store data and program instructions. The processor is configured to read and execute the program instructions from the memory. In response to execution of the program instructions, the processor is operable to: (a) receive compressed input data, wherein the compressed input data is a compressed representation of a block of samples of a first source X; (b) receive a block of samples of a second source Y; (c) apply an asymmetric Slepian-Wolf decoder to the compressed input data using the block of samples of the second source Y, wherein said applying generates a block of intermediate values; (d) perform joint decoding on each intermediate value and a corresponding sample of the block of second source samples to obtain a corresponding decompressed output value, wherein said performing joint decoding includes determining an estimate of a centroid of a function restricted to a region of space corresponding to the intermediate value, wherein said estimate determines the decompressed output value. The function is the conditional probability density function of the first source X given said corresponding sample of the second source block.

In yet another set of embodiments, a system for computing a table representing a nested quantization decoder may include a memory and processor. The memory is configured to store data and program instructions. The processor is configured to read and execute the program instructions from the memory. In response to execution of the program instructions, the processor is operable to: (a) computing a realization z of a first random vector; (b) computing a realization y of a second random vector; (c) adding z and y to determine a realization x of a source vector; (d) quantizing the realization x to a point in a fine lattice; (e) computing an index J identifying a coset of a coarse lattice in the fine lattice based on the fine lattice point; (f) adding the realization x to a cumulative sum corresponding to the index J and the realization y; (g) incrementing a count value corresponding to the index J and the realization y; (h) repeating operations (a) through (g) a number of times; (i) dividing the cumulative sums by their corresponding count values to obtain resultant values; and (j) storing the resultant values in a memory medium.

We propose a practical scheme that we refer to as Slepian-Wolf coded nested quantization (SWC-NQ) for Wyner-Ziv coding that deals with source coding with side information under a fidelity criterion. The scheme utilizes nested lattice quantization with a fine lattice for quantization and a coarse lattice for channel coding. In addition, at low dimensions (or block sizes), an additional Slepian-Wolf coding stage is added to compensate for the weakness of the coarse lattice channel code. The role of Slepian-Wolf coding in SWC-NQ is to exploit the correlation between the quantized source and the side information for further compression and to make the overall channel code stronger.

The applications of this proposed scheme are very broad; it can be used in any application that involves lossy compression (e.g., of speech data, audio data, image data, video data, graphic data, or, any combination thereof).

We show that SWC-NQ achieves the same performance of classic entropy-constrained lattice quantization. For example, 1-D/2-D SWC-NQ performs 1.53/1.36 dB away from the Wyner-Ziv rate distortion (R-D) function of the quadratic Gaussian source at high rate assuming ideal Slepian-Wolf coding. In other words, the scheme may be optimal in terms of compression performance, at least in some embodiments. We also demonstrate means of achieving efficient Slepian-Wolf compression via multi-level LDPC codes.

BRIEF DESCRIPTION OF THE DRAWINGS

A better understanding of the present invention can be obtained when the following detailed description of the preferred embodiment is considered in conjunction with the following drawings, in which.

Figure 1A:
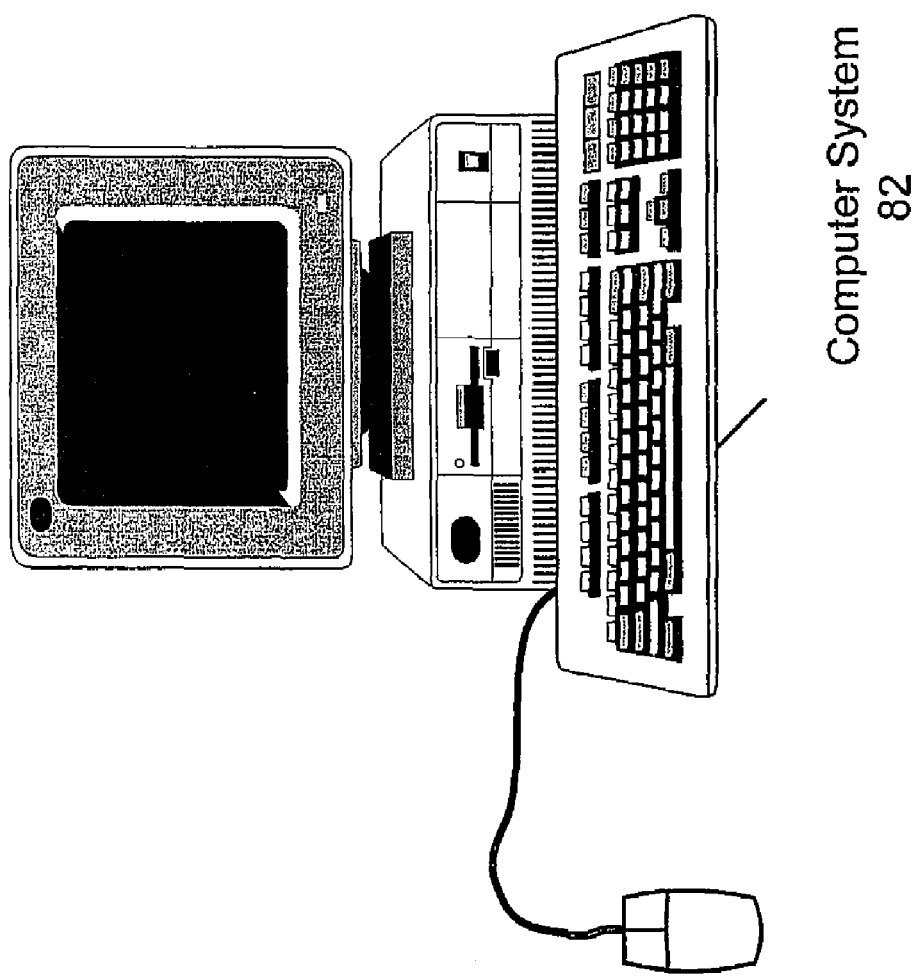
FIG. 1A illustrates one embodiment of a computer system that may be used for implementing various of the method embodiments described herein.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following patent application documents are hereby incorporated by reference in their entirety as though fully and completely set forth herein:

U.S. Provisional Application Ser. No. 60/657,520, titled "Multi-Source Data Encoding, Transmission and Decoding", filed Mar. 1, 2005, whose inventors are Vladimir M. Stankovic, Angelos D. Liveris, Zixiang Xiong, Costas N. Georghiades, Zhixin Liu, Samuel S. Cheng, and Qian Xu, including Appendices A through H;

U.S. patent application Ser. No. 11/069,935, titled "Multi-Source Data Encoding, Transmission and Decoding Using Slepian-Wolf Codes Based On Channel Code Partitioning", filed Mar. 1, 2005, whose inventors are Vladimir M. Stankovic, Angelos D. Liveris, Zixiang Xiong, and Costas N. Georghiades, including Appendices A through H; and U.S. patent application Ser. No. 11/068,737, titled "Data Encoding and Decoding Using Slepian-Wolf Coded Nested Quantization to Achieve Wyner-Ziv Coding", filed Mar. 1, 2005, whose inventors are Zhixin Liu, Samuel S. Cheng, Angelos D. Liveris, and Zixiang Xiong, including Appendices A through H.

The following publications are referred to herein and are incorporated by reference in their entirety as though fully and completely set forth herein:

[1] A. Wyner and J. Ziv, "The rate-distortion function for source coding with side information at the decoder," IEEE Trans. Inform. Theory, vol. IT-22, pp. 1-10, January 1976.

[2] A. Wyner, "The rate-distortion function for source coding with side information at the decoder-II: general sources," Inform. Contr., vol. 38, pp. 60-80, 1978.

[3] S. Servetto, "Lattice quantization with side information," in Proceedings of the IEEE Data Compression Conference, DCC2000, Snowbird, Utah, March 2000.

[4] X. Wang and M. Orchard, "Design of trellis codes for source coding with side information at the decoder," in Proc. DCC'01, Snowbird, Utah, March 2001.

[5] P. Mitran and J. Bajcsy, "Coding for the Wyner-Ziv problem with turbo-like codes," in Proc. ISIT'02, Lausanne, Switzerland, June 2002.

[6] R. Zhang A. Aaron and B. Girod, "Wyner-Ziv coding of motion video," in Proc. 36th Asilomar Conf., Pacific Grove, Calif., November 2002.

[7] S. Pradhan and K. Ramchandran, "Distributed source coding using syndromes (DISCUS): Design and construction," IEEE Trans. Inform. Theory, vol. 49, pp. 626-643, March 2003.

[8] D. Rebollo-Monedero, R. Zhang, and B. Girod, "Design of optimal quantizers for distributed source coding," in Proc. DCC'03, Snowbird, Utah, March 2003.

[9] J. Chou, S. Pradhan, and K. Ramchandran, "Turbo and trellis-based constructions for source coding with side information," in Proc. DCC'03, Snowbird, Utah, March 2003.

[10] A. Liveris, Z. Xiong and C. Georghiades, "Nested convolutional/turbo codes for the binary Wyner-Ziv problem," in Proc. ICIP'03, Barcelona, Spain, September 2003.

[11] Z. Xiong, A. Liveris, S. Cheng, and Z. Liu, "Nested quantization and Slepian-Wolf coding: A Wyner-Ziv coding paradigm for i.i.d. sources," in Proc. IEEE Workshop on Statistical Signal Processing, St. Louis, Mo., September 2003.

[12] Y. Yang, S. Cheng, Z. Xiong, and W. Zhao, "Wyner-Ziv coding based on TCQ and LDPC codes," in Proc. 37th Asilomar Conf., Pacific Grove, Calif., November 2003.

[13] J. H. Conway and Neil J. A. Sloane, "Sphere Packings, Lattices and Groups", Springer, N.Y., 1998.

[14] G. Ungerboeck, "Channel coding with multilevel/phase signals," IEEE Trans. Inform. Theory, vol. 28, pp. 55-67, January 1982.

[15] M. Marcellin and T. Fischer, "Trellis coded quantization of memoryless and Gaussian-Markov sources," IEEE Communications, vol. 38, pp. 82-93, January 1990.

[16] R. Zamir and S. Shamai, "Nested linear/lattice codes for Wyner-Ziv encoding," in Proc. IEEE Information Theory Workshop, Killarney, Ireland, June 1998, pp. 92-93.

[17] J. Conway, E. Rains, and N. Sloane, "On the existence of similar sublattices," Canadian J. Math., vol. 51, pp. 1300-1306, 1999.

[18] R. Zamir, S. Shamai, and U. Erez, "Nested linear/lattice codes for structured multiterminal binning," IEEE Trans. Inform. Theory, vol. 48, pp. 1250-1276, June 2002.

[19] M. V. Eyuboglu and G. D. Formey, Jr., "Lattice and trellis quantization with lattice- and trellis-bounded codebooks—high-rate theory for memoryless sources," IEEE Trans. Information Theory, vol. 39, pp. 46-59, January 1993.

[20] Robert G. Gallager, Low Density Parity Check Codes, MIT Press, 1963, ISBN: 0262571773.

[21] D. MacKay, "Good error-correcting codes based on very sparse matrices," IEEE Trans. Information Theory, vol. 45, pp. 399-431, March 1999.

[22] D. MacKay and R. Neal, "Near shannon limit performance of low density parity check codes," Electron. Lett., vol. 33, pp. 457-458, March 1997.

[23] D. Rebollo-Monedero, A. Aaron, and B. Girod, "Transforms for high-rate distributed source coding," in Proc. 37th Asilomar Conf., Pacific Grove, Calif., November 2003.

[24] D. Slepian and J. K. Wolf, "Noiseless coding of correlated information sources," IEEE Trans. Inform. Theory, vol. 19, pp. 471-480, July 1973.

[25] R. Zamir, "The rate loss in the Wyner-Ziv problem," IEEE Trans. Inform. Theory, vol. 42, pp. 2073-2084, November 1996.

[26] V. Tarokh, A. Vardy, and K. Zeger, "Universal bound on the performance of lattice codes," IEEE Trans. Inform. Theory, vol. 45, pp. 670-681, March 1999.

[27] Lori A. Dalton, "Analysis of 1-D nested lattice quantization and Slepian-Wolf coding for Wyner-Ziv coding of i.i.d. sources," May 2002, Technical report, Texas A&M University.

[28] G. D. Formey Jr., "Coset codes-Part II: Binary lattices and related codes," IEEE Trans. Inform. Theory, vol. 34, pp. 1152-1187, 1988.

[29] A. Liveris, Z. Xiong and C. Georghiades, "Compression of binary sources with side information at the decoder using LDPC codes," IEEE Communications Letters, vol. 6, pp. 440-442, October 2002.

[30] T. M. Cover and J. A. Thomas, Elements of Information Theory, Wiley Interscience, 1991.

[31] R. G. Gallager, Information Theory and Reliable Communication, New York: Wiley, 1968.

Terminology.

The following is a glossary of terms used in the present application:

Memory Medium—Any of various types of memory devices, storage devices, or combinations thereof. The term "memory medium" is intended to include: CD-ROM, any of various kinds of magnetic disk (such as floppy disk or hard disk), any of various kinds of magnetic tape, optical storage, and bubble memory; any of various kinds of read only memory (ROM); any of various kinds of random access memory (RAM) such as DRAM, DDR RAM, SRAM, EDO RAM, Rambus RAM, etc.

Carrier Medium—a memory medium as described above, or, a communication medium on which signals are conveyed, e.g., signals such as electrical, electromagnetic, acoustic, optical signals.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), or other types of programmable hardware. A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more components that interoperate.

Hardware Configuration Program—a program, e.g., a netlist or bit file, that can be used to program or configure a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

FIG. 1A—Computer System.

FIG. 1A illustrates a computer system 82, according to one set of embodiments, operable to execute a set of programs. The programs may be configured to implement any or all of the method embodiments described herein. The computer system 82 may include one or more processors, memory media, and one or more interface devices. The computer system 82 may also include input and output devices. The memory media may include various well known systems and devices configured for the storage of data and computer programs. For example, the memory media may store one or more programs which are executable to perform the methods (or some subset of the methods) described herein. The memory medium may also store operating system software, as well as other software for operation of the computer system. In various embodiments, the computer system 82 may be a personal computer, a notebook computer, a workstation, a server, a router, a computer implemented on a card, etc.

Figure 1B:
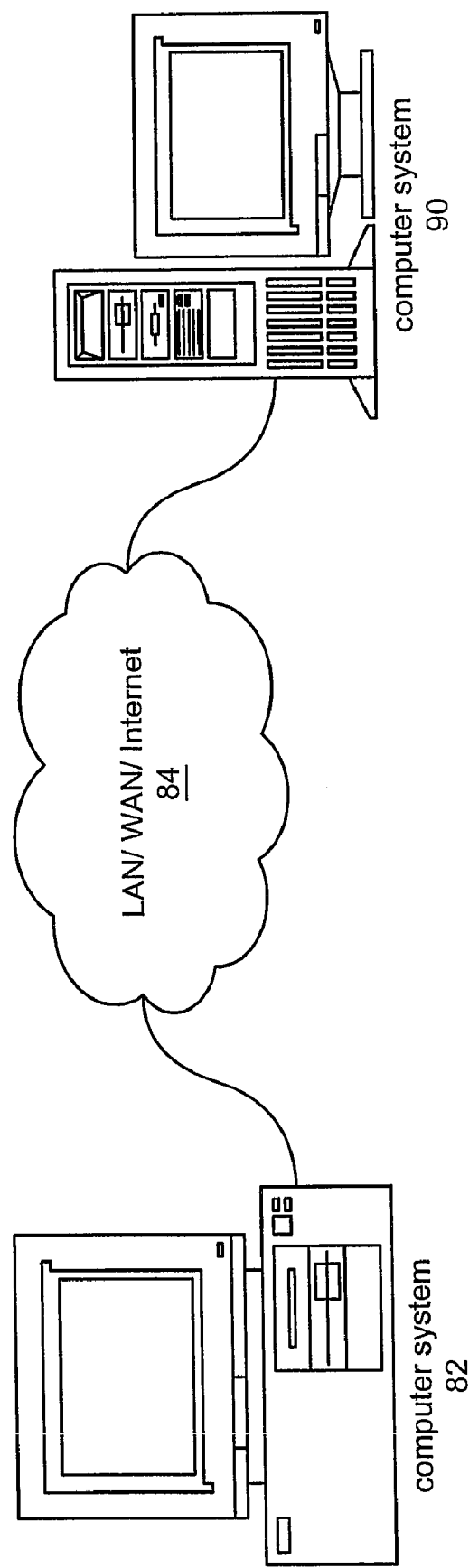
FIG. 1B illustrates one embodiment of a communication system including two computers coupled through a computer network.

FIG. 1B—Computer Network.

FIG. 1B illustrates a communication system including a first computer system 82 and a second computer system 90, according to one set of embodiments. The first computer system 82 couples to the second computer system 90 through a network 84 (or, more generally, any of various known communication mechanisms). The first and second computer systems may each be any of various types, as desired. The network 84 can also be any of various types, including a LAN (local area network), WAN (wide area network), the Internet, or an Intranet.

Each of the computer systems may be configured with programs implementing any or all of the method embodiments described herein. In one embodiment, the first and second computer systems are each configured with software for encoding and decoding data as described variously herein.

It is noted that computer system 82 and computer system 90 may be configured according to any of various system architectures.

Figure 2:
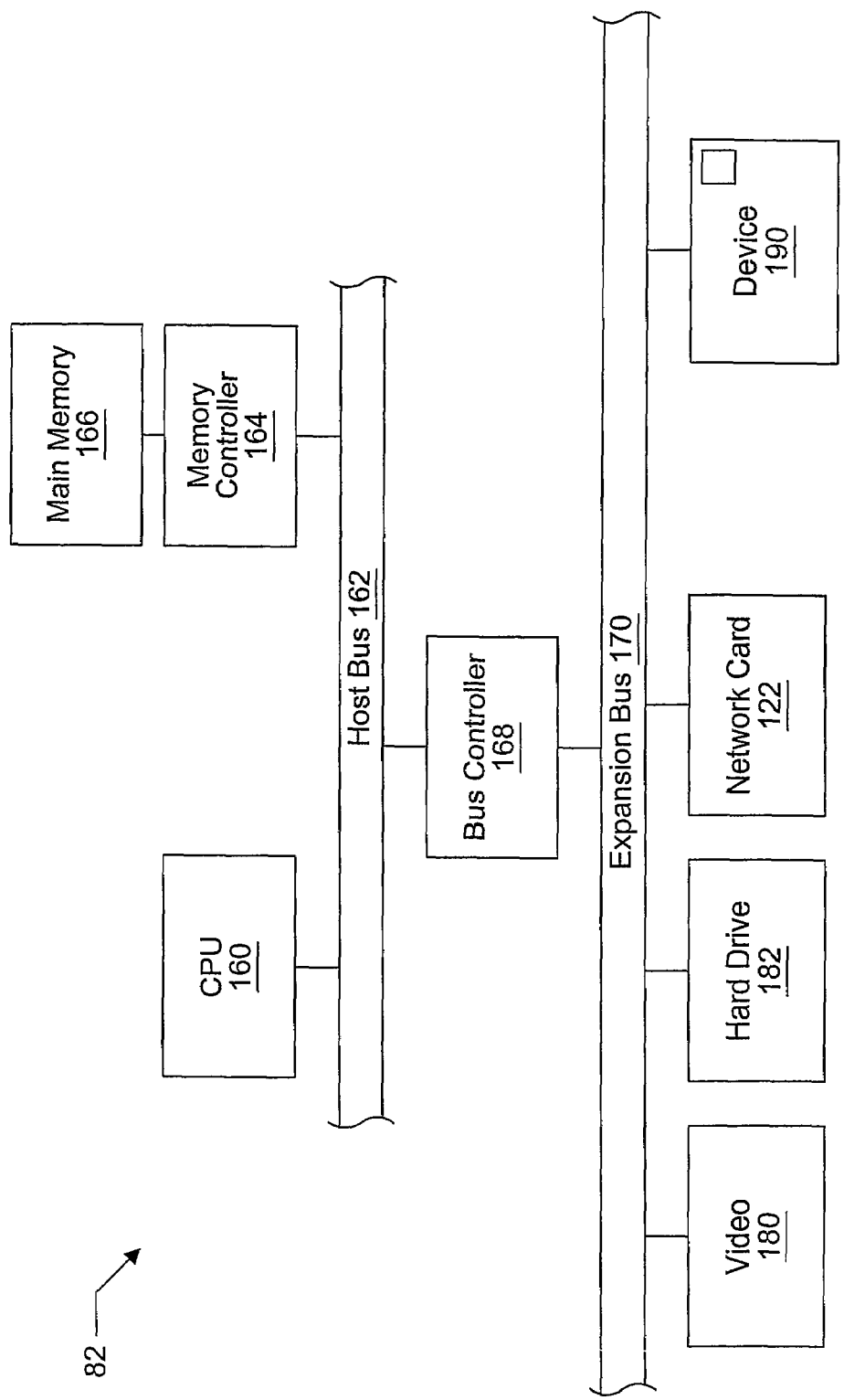
FIG. 2 is a block diagram for one embodiment of a computer system that may be used for implementing various of the method embodiments described herein.

FIG. 2—Computer System Block Diagram.

FIG. 2 is a block diagram representing one embodiment of computer system 82 and/or computer system 90.

The computer system may include at least one central processing unit CPU 160 which is coupled to a host bus 162. The CPU 160 may be any of various types, including, but not limited to, an x86 processor, a PowerPC processor, a CPU from the SPARC family of RISC processors, as well as others. A memory medium, typically comprising RAM, and referred to as main memory 166, is coupled to the host bus 162 by means of memory controller 164. The main memory 166 may store programs operable to implement encoding and/or decoding according to any (or all) of the various embodiments described herein. The main memory may also store operating system software, as well as other software for operation of the computer system.

The host bus 162 couples to an expansion or input/output bus 170 through a bus controller 168 or bus bridge logic. The expansion bus 170 may be the PCI (Peripheral Component Interconnect) expansion bus, although other bus types can be used. The expansion bus 170 includes slots for various devices such as a video card 180, a hard drive 182, a CD-ROM drive (not shown) and a network interface 122. The network interface 122 (e.g., an Ethernet card) may be used to communicate with other computers through the network 84.

In one embodiment, a device 190 may also be connected to the computer. The device 190 may include an embedded processor and memory. The device 190 may also or instead comprise a programmable hardware element (such as an FPGA). The computer system may be operable to transfer a program to the device 190 for execution of the program on the device 190. The program may be configured to implement any or all of the encoding or decoding method embodiments described herein.

In some embodiments, the computer system 82 may include input devices such as a mouse and keyboard and output devices such a display and speakers.

Figure 3A:
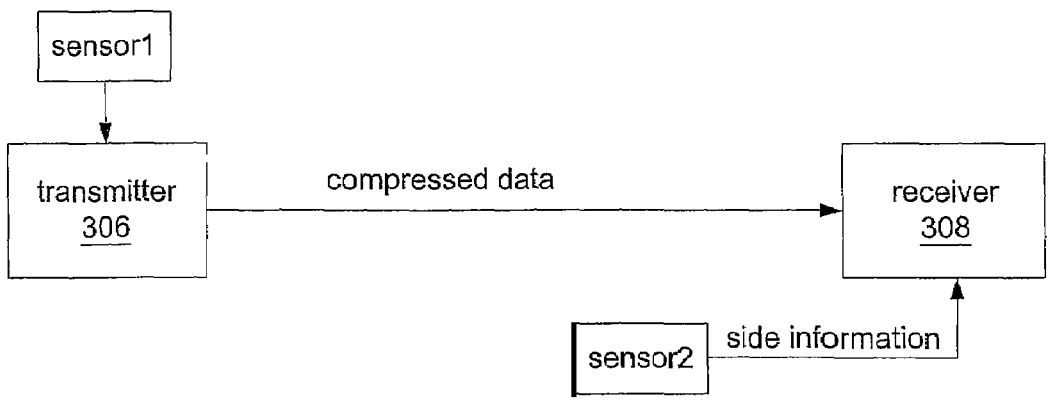
FIG. 3A illustrates one embodiment of a sensor system as a possible application of the inventive principles described herein.
Figure 3B:
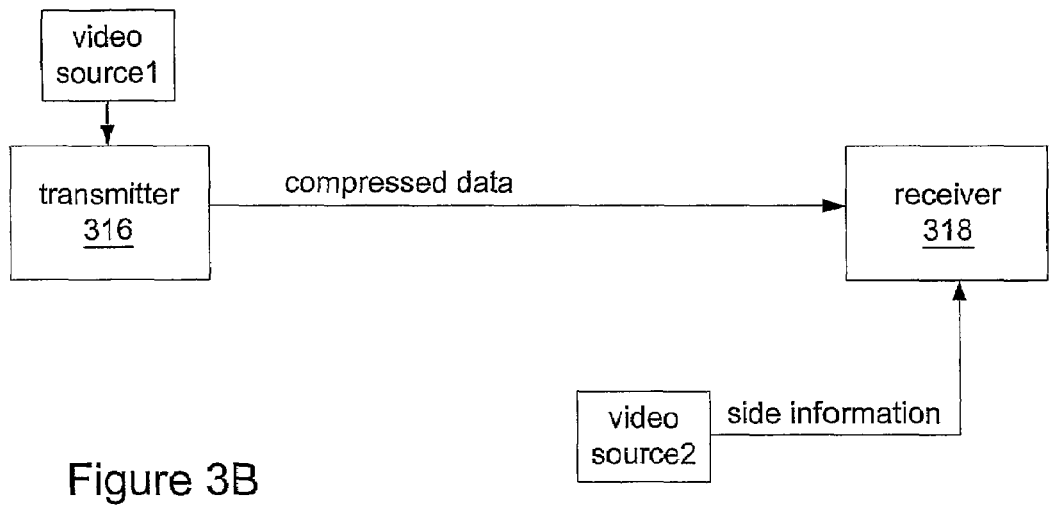
FIG. 3B illustrates one embodiment of a video transmission as another possible application of the inventive principles described herein.
Figure 3C:
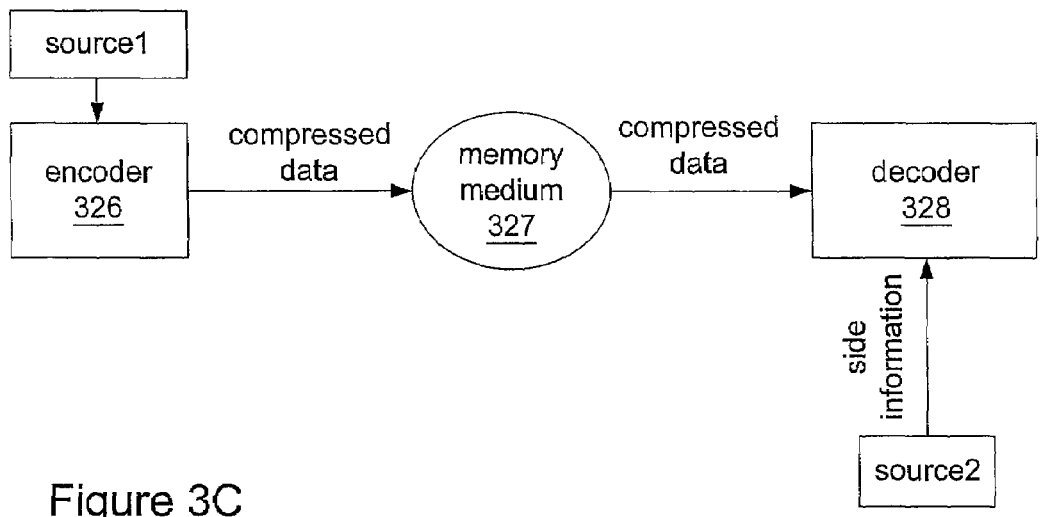
FIG. 3C illustrates a system that compressed source information and stored the compressed information in a memory medium for later retrieval and decompression.

FIGS. 3A, 3B & 3C—Exemplary Systems.

Various embodiments of the present invention may be directed to sensor systems, wireless or wired transmission systems, or, any other type of information processing or distribution system utilizing the coding principles described herein.

For example, as FIG. 3A shows, a sensor system may include a first sensor (or set of sensors) and a second sensor (or set of sensors). The first sensor may provide signals to a transmitter 306. The sensors may be configured to sense any desired physical quantity or set of physical quantities such as time, temperature, energy, velocity, flow rate, displacement, length, mass, voltage, electrical current, charge, pressure, etc. The transmitter 306 may receive the signals, digitize the signals, encode the signals according the inventive principles described herein, and transmit the resulting compressed data to a receiver 308 using any of various known communication mechanism (e.g., a computer network). The receiver 308 receives the compressed data from the transmitter as well as side information from a second sensor. The receiver 308 decodes the compressed data, according to the inventive principles described herein, using the side information, and thereby, generates decompressed output data. The decompressed output data may be used as desired, e.g., displayed to a user, forwarded for analysis and/or storage, etc.

As another example, a first video source may generate video signals as shown in FIG. 3B. A transmitter 316 receives the video signal, encodes the video signals according the inventive principles described herein, and transmits the resulting compressed data to a receiver 318 using any of various known communication mechanism (e.g., a computer network). The receiver 318 receives the compressed data from the transmitter as well as side information from a second sensor. The receiver 318 decoders the compressed data, according to the inventive principles described herein, using the side information.

As yet another embodiment, a encoder 326 may receive signals from a first source and encode the source signals according to the inventive principles described herein, and store the resulting compressed data onto a memory medium 327. At some later time, an encoder 328 may read the compressed data from the memory medium 327 and decode the compressed data according to the inventive principles described herein.

It is noted that embodiments of the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including audio applications, video applications, multimedia applications, any application where physical measurements are gathered, etc.

Figure 4:
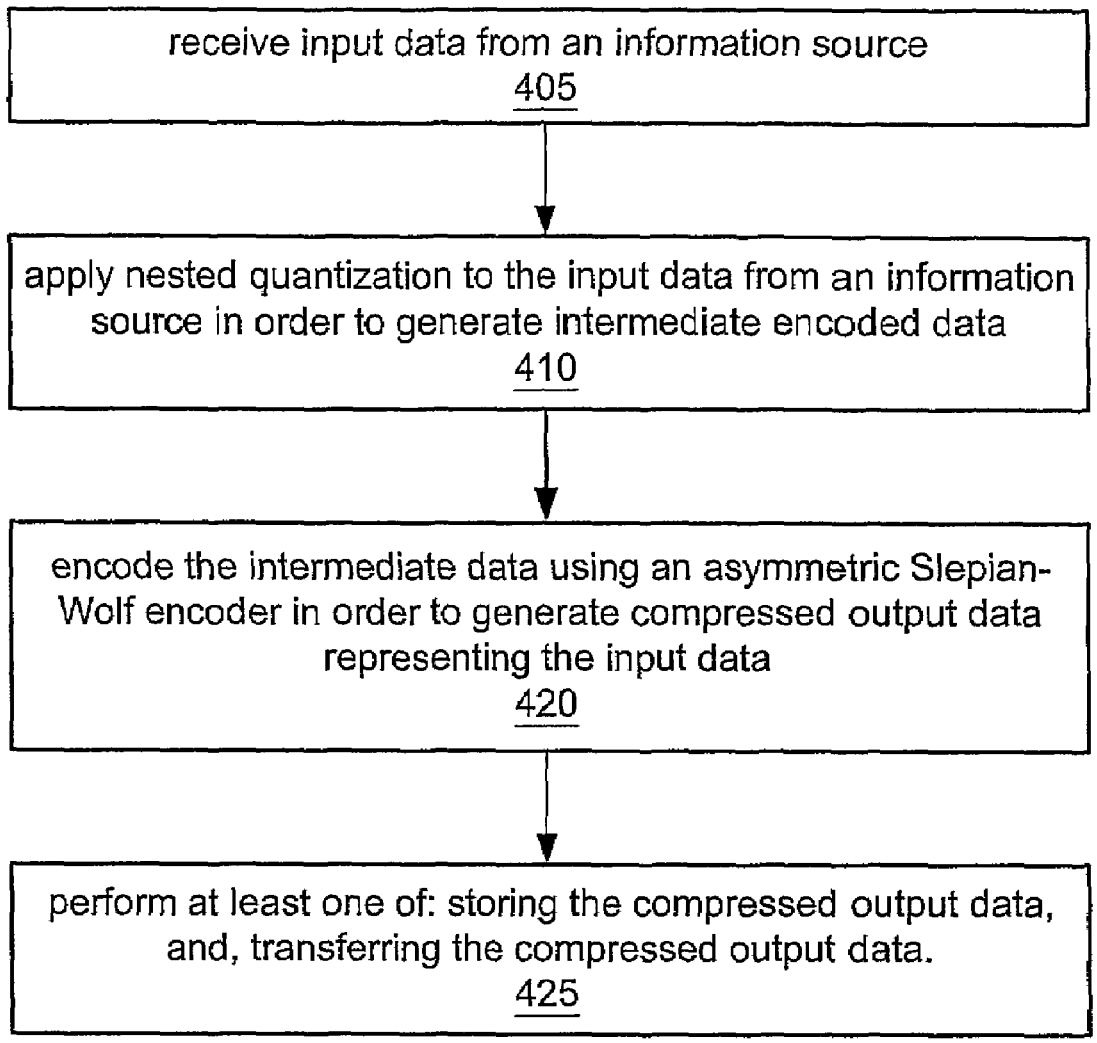
FIG. 4 illustrates one embodiment of a method for encoding data.

FIG. 4 illustrates one embodiment of a method for decoding data. In step 405, input data is received from an information source.

In step 410, nested quantization as described herein is applied to the input data in order to generate intermediate data.

In step 420, the intermediate data is encoded using an asymmetric Slepian-Wolf encoder as described herein, in order to generate compressed output data representing the input data.

The nested quantization and asymmetric Slepian-Wolf encoder may be configured so that the combination of steps 410 and 420 realizes the encoder portion of a Wyner-Ziv code.

In step 425, the compressed output data may be stored and/or transferred. In one embodiment, the compressed output data may be stored onto a memory medium for decompression at some time in the future. In another embodiment, the compressed output data may be transferred, e.g., to a decoder device.

The information source may be a continuous source or a discrete source. A discrete source generates values in a finite set. A continuous source generates values in a continuum. The values of the input data may be interpreted as vectors in an n-dimensional space, where n is greater than or equal to one.

The process of applying nested quantization to the input data may include: quantizing values of the input data with respect to a fine lattice to determine corresponding points of the fine lattice; and computing indices identifying cosets of a coarse lattice in the fine lattice corresponding to the fine lattice points. The intermediate data include said indices. The coarse lattice is a sublattice of the fine lattice.

In any given dimension, some choices for the fine lattice and coarse lattice may lead to better performance than others. However, the principles of the present invention may be practiced with non-optimal choices for the fine lattice and coarse lattice as well as with optimal choices.

In various embodiments, the information source may be a source of audio information, a source of video information, a source of image information, a source of text information, a source of information derived from physical measurements (e.g., by a set of one or more physical sensors), or, any combination thereof.

As discussed in reference [29], one way to do asymmetric Slepian-Wolf encoding is by means of syndrome forming, which involves a modification of classical channel encoding. This type of Slepian-Wolf encoding is used to generate the simulation results described in this paper. However, the general method of Slepian-Wolf coded nested quantization disclosed in this paper can also be performed with other forms of Slepian-Wolf encoders.

In some embodiments, the asymmetric Slepian-Wolf encoder may be a low density parity check syndrome former or a turbo syndrome former.

In one embodiment, the asymmetric Slepian-Wolf encoder may be configured as a multi-layered encoder as described herein.

An encoder system may be configured to implement any embodiment of the method illustrated and described above in connection with FIG. 4. The encoder system may include one or more processors or programmable hardware elements, and/or, dedicated circuitry such as application specific integrated circuits. In one embodiment, the encoder system includes a processor (e.g., a microprocessor) and memory. The memory is configured to store program instructions and data. The processor is configured to read and execute the program instructions from the memory to implement any embodiment of the method illustrated and described above in connection with FIG. 4.

Furthermore, a computer-readable memory medium may be configured to store program instructions which are executable by one or more processors to implement any embodiment of the method illustrated and described above in connection with FIG. 4.

Figure 5:
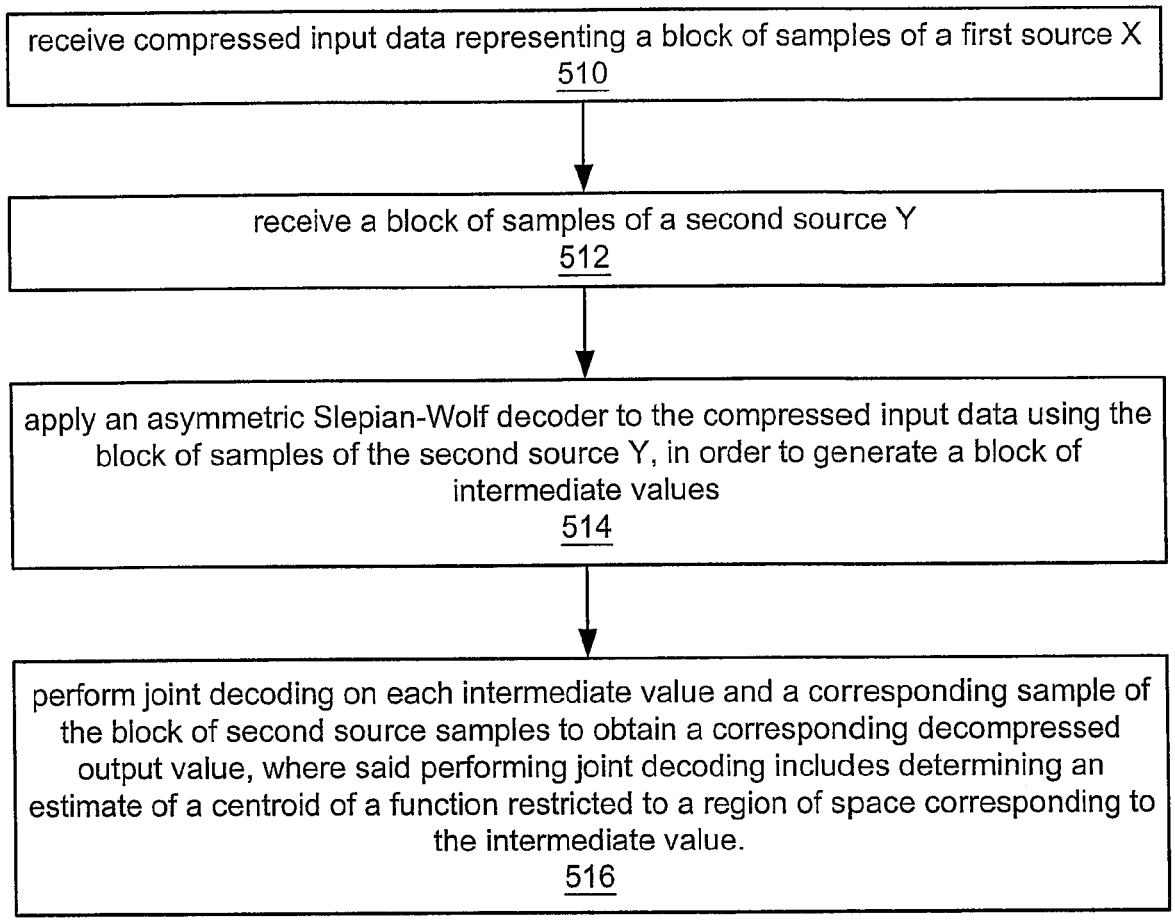
FIG. 5 illustrates one embodiment of a method for decoding data using side information.

FIG. 5 illustrates one embodiment of a method for decoding data. In step 510, compressed input data is received. The compressed input data is a compression representation of a block of samples of a first source X. In step 512, a block of samples of a second source Y is received. Steps 510 and 512 need not be performed in any particular order. In one embodiment, steps 510 and 512 may be performed in parallel, or, at least in a time overlapping fashion. The first source X and the second source Y may be statistically correlated.

In step 514, an asymmetric Slepian-Wolf decoder as described herein is applied to the compressed input data using the block of samples of the second source Y. This application of the asymmetric Slepian-Wolf decoder generates a block of intermediate values.

In step 516, joint decoding is performed on each intermediate value and a corresponding sample of the block of second source samples to obtain a corresponding decompressed output value. The joint decoding may include determining an estimate of a centroid of a function restricted to a region of space corresponding to the intermediate value. The function may be the conditional probability density function of the first source X given said corresponding sample of the second source block. The centroid estimate may be (or may determine) the decompressed output value. The resulting block of decompressed output values may be used in any of various ways as desired. For example, the block of decompressed output values may be displayed to a user, forwarded for analysis and/or storage, transmitted through a network to one or more other destinations, etc.

The steps 514 and 516 may be configured so as to realize the decoder portion of a Wyner-Ziv code.

The region of space is a union of cells (e.g., Voronoi cells) corresponding to a coset of a coarse lattice in a fine lattice, wherein the coset is identified by the intermediate value.

The centroid estimate may be determined by reading the centroid estimate from a table stored in a memory medium using said corresponding sample of the second source block and the intermediate value as addresses. The table may be computed in at a central code design facility, and, then deployed to a decoder system through any of various known means for data distribution. The table may be stored in a memory medium of the decoder system. The decoder system may accessing the table to determine the centroid estimate in real time.

In one alternative embodiment, the centroid estimate may be determined by performing a Monte Carlo iterative simulation at decode time.

The intermediate values generated in step 514 may specify cosets of a coarse lattice in a fine lattice. The coarse lattice may be a sublattice of the fine lattice.

The asymmetric Slepian-Wolf decoder may be a multi-layered decoder. Furthermore, the asymmetric Slepian-Wolf decoder may be a low density parity check decoder or a turbo decoder.

A decoder system may be configured to implement any embodiment of the method illustrated and described above in connection with FIG. 5. The decoder system may include one or more processors or programmable hardware elements, and/or, dedicated circuitry such as application specific integrated circuits. In one embodiment, the decoder system includes a processor (e.g., a microprocessor) and memory. The memory is configured to store program instructions and data. The processor is configured to read and execute the program instructions from the memory to implement any embodiment of the method illustrated and described above in connection with FIG. 5.

Furthermore, a computer-readable memory medium may be configured to store program instructions which are executable by one or more processors to implement any embodiment of the method illustrated and described above in connection with FIG. 5.

Figure 6:
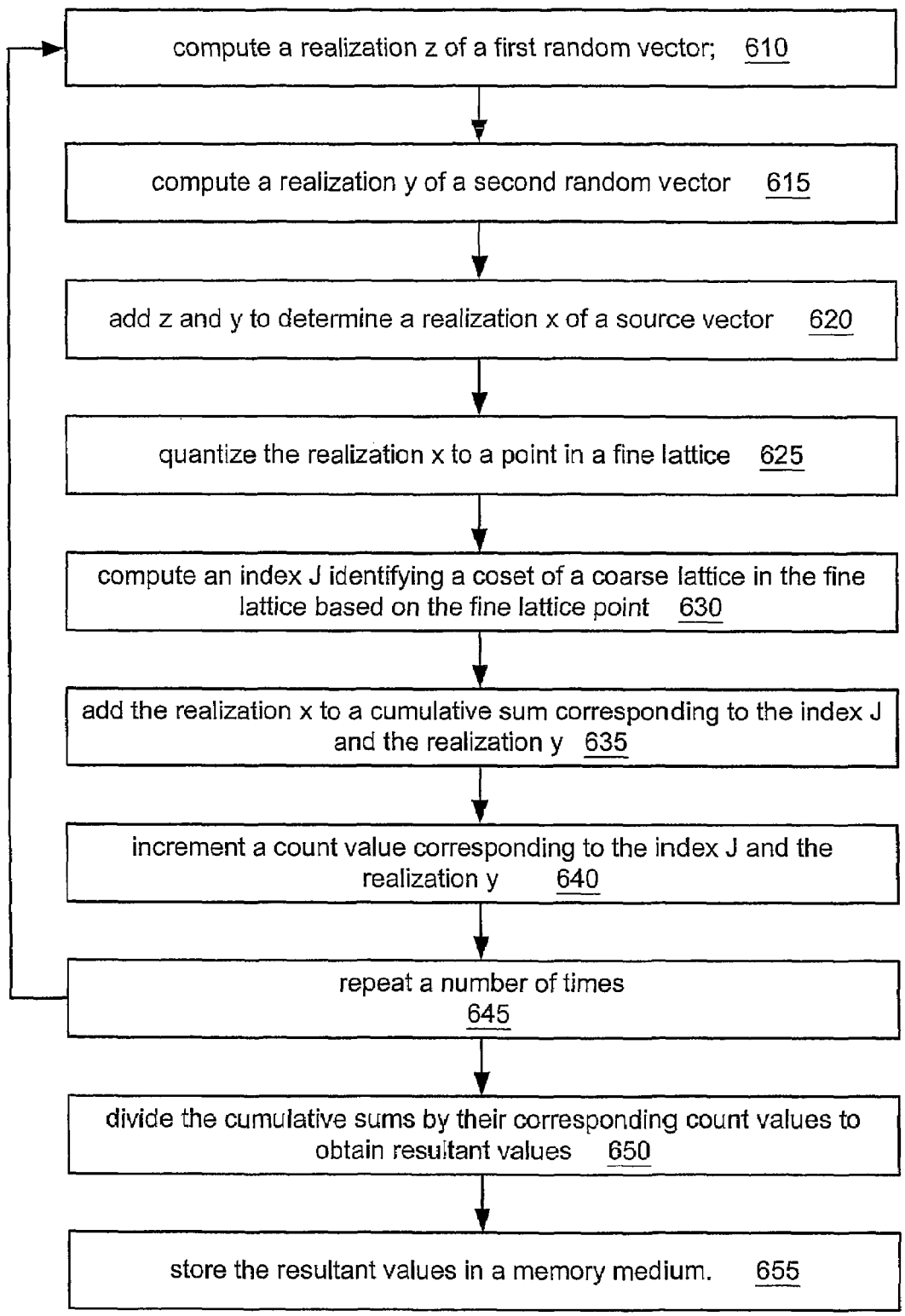
FIG. 6 illustrates one embodiment of a method for computing a table that represents an nested quantization decoder.

FIG. 6 illustrates one embodiment of a method for computing a table representing a nested quantization decoder by Monte Carlo simulation. The method may be implemented by executing program instructions on a computer system (or a set of interconnected computer systems). The program instructions may be stored on any of various known computer-readable memory media.

In step 610, the computer system may compute a realization z of a first random vector (the auxiliary vector), e.g., using one or more random number generators. In step 615, the computer system may compute a realization y of a second random vector (the side information), e.g., using one or more random number generators. Steps 610 and 615 need not be performed in any particular order.

In step 620, the computer system may add the realization y and the realization z to determine a realization x of a source vector.

In step 625, the computer system may quantize the realization x to a point p in a fine lattice as described herein.

In step 630, the computer system may compute an index J identifying a coset of a coarse lattice in the fine lattice based on the fine lattice point p. The coarse lattice is a sublattice of the fine lattice.

The computer system may maintain a set of cumulative sums, i.e., one cumulative sum for each possible pair in the Cartesian product (CPR) of the set of possible indices and the set of possible realizations of the second random vector (the side information). The cumulative sums may be initialized to zero. Furthermore, the computer system may maintain a set of count values, i.e., one count value for each possible pair in the Cartesian product CPR.

In step 635, the computer system may add the realization x to a cumulative sum corresponding to the index J and the realization y. In step 640, the computer system may increment a count value corresponding to the index J and the realization y. Steps 635 and 640 need not be performed in any particular order.

The computer system may repeat steps 610 through 640 a number of times as indicated in step 645. In one embodiment, the number of repetitions may be determined by input provided by a user.

In step 650, the computer system may divide the cumulative sums by their corresponding count values to obtain resultant values. The resultant values may be interpreted as being the centroid estimates described above in connection with FIG. 5.

In step 655, the computer system may store the resultant values as a table in a memory associated with the computer system, e.g., onto hard disk.

The table may be distributed (e.g., with decoding software configured according to any of the various method embodiments described herein) to decoder systems by any of various means. In one embodiment, the table may be downloaded to decoder systems over a network such as the Internet. In another embodiment, the table may be stored on a computer-readable memory media (such as CD-ROM, magnetic disk, magnetic tape, compact flash cards, etc.) and the memory media may be provided (e.g., sold) to users of decoder systems for loading onto their respective computer systems.

In one embodiment, system for computing a table representing a nested quantization decoder may be configured with a processor and memory. The memory is configured to store program instructions and data. The processor is configured to read and execute the program instructions from the memory to implement any embodiment of the method illustrated and described above in connection with FIG. 6.

The Wyner-Ziv coding problem deals with source coding with side information under a fidelity criterion. The rate-distortion function for this setup, R*(D), is given by [1]:

$$R^*(D) = \min_{p(u|x)} \min_{f: A_U \times A_Y \to A_{\hat{X}}} [I(U;X) - I(U;Y)], \quad (1)$$

where the source X (with an alphabet $A_X$), the side information Y (with an alphabet $A_Y$) and the auxiliary random variable U (with an alphabet Au) form a Markov chain as Y↔X↔U, with the distortion constraint $E[d(X,f(U,Y),Y)] \leq D$. The function I(·) denotes the Shannon mutual information as defined in [3]. The function p(u|x) is the conditional probability of U given X. The function f represents the mapping from the possible auxiliary variable and side information to a reconstructed value of X.

Although the theoretical limits for the rate-distortion function have been known for some time [1], [2], practical approaches to binary Wyner-Ziv coding and continuous Wyner-Ziv coding have not appeared until recently [3], [4], [5], [6], [7], [8], [9], [10], [11], [12]. A common context of interest for continuous Wyner-Ziv coding is code design for the quadratic Gaussian case, where the correlation between the source X and the side information Y is modeled as an additive white Gaussian noise (AWGN) channel as X=Y+Z, Z→N(0, $\sigma_Z^2$), with a mean-squared error (MSE) measure. For this case, one can first consider lattice codes [13] or trellis-based codes [14], [15] that have been used for both source and channel coding in the past, and focus on finding good nesting codes among them. Following Zamir et al.'s nested lattice coding scheme [16], Servetto [3] proposed explicit nested lattice constructions based on similar sublattices [17] with the assumption of high correlation. Research on trellis-based nested codes as a way of realizing high-dimensional nested lattice codes has just started recently [7]. For example, in DISCUS [7], two source codes (scalar quantization and trellis coded quantization—TCQ) and two channel codes (scalar coset code and trellis-based coset code [14]) are used in source-channel coding for the Wyner-Ziv problem, resulting in four combinations. One of them (scalar quantization with scalar coset code) is nested scalar quantization and another one (TCQ with trellis-based coset code, also suggested in [4]) can effectively be considered as nested TCQ.

Zamir et al. [18], [16] first outlined some theoretical constructions using a pair of nested linear/lattice codes for binary/Gaussian sources, where the fine code in the nested pair plays the role of source coding while the coarse code does channel coding. They also proved that, for the quadratic Gaussian case, the Wyner-Ziv rate-distortion (R-D) function is asymptotically achievable using nested lattice codes, with the assumption that the lattice is ideally sphere-packed as the lattice dimension goes to infinity.

The performance of a nested lattice quantizer can approach the Wyner-Ziv limit at high rate when high-dimensional lattices are used, because both the granular gain and boundary gain reach their ultimate values [19] when the dimension n→∞. Nevertheless, lattice coding and code design with high dimensionality are difficult in practice.

For a nested lattice quantizer using low-to-moderate dimensional lattices, a pragmatic approach to boost the overall performance is to increase the boundary gain with a second stage of binning, without increasing the dimensionality of the lattices. Suppose a second stage of binning is applied without introducing extra overload probability $P_{ol}$, and the binning scheme partitions the support region of fine lattice (actually the Voronoi region of the coarse lattice for nested lattice quantizer) into m cosets. Thus the volume of the support region decreases by a factor of N/m while the overload probability stays fixed, where N is the nesting ratio. From the definition of boundary gain [19], the boundary gain increases without changing the dimension of the lattices. Since various possible boundary gains are realizable using the second-stage of binning as discussed above, there is only maximally 1.53 dB (decibels) of granular gain left unexploited by the quantizer. Thus the second stage of binning allows us to show the theoretical performance limits at high rates with low-to-moderate dimensional source codes.

In this paper, we introduce a new framework for the continuous Wyner-Ziv coding of independent and identically distributed (i.i.d.) sources based a combination of Slepian-Wolf coding (SWC) and nested quantization (NQ). In this framework, which we refer to as SWC-NQ, the role of Slepian-Wolf coding, as a second-stage of binning which increases the boundary gain of source coding, is to exploit the correlation between the quantized source and the side information for further compression and by making the overall channel code stronger.

SWC-NQ connects network information theory with the rich areas of (a) lattice source code designs (e.g., [13]) and (b) channel code designs (e.g., LDPC codes [20], [21] and [22]), making it feasible to devise codes that can approach the Wyner-Ziv rate-distortion function. LDPC is an acronym for "low density parity check".

For the quadratic continuous case, we establish the high-rate performance of SWC-NQ with low-to-moderate dimensional nested quantization and ideal SWC. We show that SWC-NQ achieves the same performance of classic entropy-constrained lattice quantization as if the side information were also available at the encoder. For example, 1-D/2-D SWC-NQ performs 1.53/1.36 dB away from the Wyner-Ziv R-D function of the quadratic continuous source at high rate assuming ideal SWC.

A recent work, [23], starts with non-uniform quantization with index reuse and Slepian-Wolf coding and shows the same high-rate theoretical performance as ours when the quantizer becomes an almost uniform one without index reuse. This agrees with our assertion that at high rates, the nested quantizer asymptotically becomes a non-nested regular one so that strong channel coding is guaranteed.

We also implement 1-D and 2-D nested lattice quantizers in the rate range of 1-7 bits per sample. Although our analysis shows that nesting does not help at high rate, experiments using nested lattice quantizers together with irregular LDPC codes for SWC obtain performances close to the corresponding limits at low rates. Our work thus shows that SWC-NQ provides an efficient scheme for practical Wyner-Ziv coding with low-dimensional lattice quantizers at low rates.

Although the theoretical analyses are taken under the assumption of high rate, the rate-distortion performance at low rate is still consistent with the one at high rate, i.e., SWC-NQ achieves the same performance of classic entropy coded quantization (ECQ) as if the side information were also available at the encoder even at low rate, when a non-linear estimator is applied at the decoder. This non-linear estimator, as we present in this paper, is the optimal one in the sense of the MSE measurement. At high rates, the non-linear estimator reduces to the linear one analyzed in this paper.

We note that the non-linear estimation in the decoder can yield significant gains for low rates and for high rates it cannot help noticeably. This is confirmed by the agreement of the high rate analysis results in this paper, which assume that the linear estimation is used, with the high rate simulation results, for which the non-linear estimation method is always used.

The following is a list of some of the contents of this paper:

1. A theoretical analysis and simulation for low-to-moderate dimensional nested lattice quantization at high rates. The rate-distortion function for general continuous sources with arbitrary probability density function (PDF) and MSE measurement, and a theoretical lower bound of rate-distortion function for the quadratic Gaussian case, are presented.

2. An analysis of the granular and boundary gains of the source coding component of nested lattice quantization. This analysis explains the phenomenon of an increasing gap of the rate-distortion function of nested lattice quantization at low-to-moderate dimension, with respect to the Wyner-Ziv limit, as we observe in the simulation.

3. A new Wyner-Ziv coding framework using nested lattice quantization and Slepian-Wolf coding, which we refer to as SWC-NQ, is introduced. The SWC-NQ rate-distortion function for general continuous sources with arbitrary PDF and MSE measurement is presented, and is in agreement with the performance of entropy-constrained lattice quantization as if the side information were available at the encoder.

4. A non-linear estimator for the decoder corresponding to the nested quantizer is presented, and is proved to be optimal in sense of MSE measurement. This estimator helps to improve the performance of SWC-NQ at low rates, and is consistent with the analytical performance at high rates.

5. Examples of practical code design using a 1-D (scalar) lattice and 2-D (hexagonal) lattice, and multi-layer irregular LDPC codes, are given in this paper.

Some Background on Wyner-Ziv Coding.

In this section, we briefly review the basic concepts and milestone theorems of Wyner-Ziv coding. Wyner and Ziv [1], [2] present the limit of rate-distortion performance for lossy coding with side information, for both Gaussian and general sources.

The problem of rate distortion with side information at the decoder asks the question of how many bits are needed to encode X under the constraint that $E[d(X,\hat{X})] \leq D$, assuming the side information Y is available at the decoder but not at the encoder. This problem generalizes the setup of [24] in that coding of X is lossy with respect to a fidelity criterion rather than lossless. For both discrete and continuous alphabets of $A_X$ and general distortion metrics $d(\cdot)$, Wyner and Ziv [1] gave the rate-distortion function $R_{WZ}^*(D)$ for this problem as $R_{WZ}^*(D) = \inf I(X; Z|Y)$, where the infimum is taken over all random variables Z such that $Y \to X \to Z$ is a Markov chain and there exists a function $\hat{X} = X(Z,Y)$ satisfying $E[d(X,\hat{X})] \leq D$. According to [1], $$R_{WZ}^*(D) \geq R_{X|Y}(D) = \inf_{\{\hat{X} \in A_X: E[d(X,\hat{X})] \leq D\}} I(X; \hat{X} | Y).$$

This means that usually there is a rate loss in the Wyner-Ziv problem. Zamir quantified this loss in [25]. In particular, Zamir showed a rate loss of less than 0.22 bit for a binary source with Hamming distance, and a rate loss of less than 0.5 bit/sample for continuous sources with MSE distortion.

Note that when D=0, the Wyner-Ziv problem degenerates to the Slepian-Wolf problem with $R_{WZ}^*(0) = R_{X|Y}(0) = H(X|Y)$. Another special case of the Wyner-Ziv problem is the quadratic Gaussian case when X and Y are zero mean and stationary Gaussian memoryless sources and the distortion metric is MSE. Let $X_i$ denote the $i^{th}$ component of X, and $Y_i$ denotes the $i^{th}$ component of Y, i=1, 2, . . . , n. Let the covariance matrix of $(X_i, Y_i)$ be $$\text{cov}(X_i, Y_i) = \begin{bmatrix} \sigma_X^2 & \rho\sigma_X\sigma_Y \\ \rho\sigma_X\sigma_Y & \sigma_Y^2 \end{bmatrix}$$

with $|\rho|<1$ for all n, then $$R_{WZ}^*(D) = R_{X|Y}(D) = \frac{1}{2}\log^+\left[\frac{\sigma_X^2(1-\rho^2)}{D}\right],$$

where $\log^+ x = \max\{0, \log x\}$. This case is of special interest in practice because many image and video sources can be modeled as jointly Gaussian (after mean subtraction) and Wyner-Ziv coding suffers no rate loss.

Lattices and Nested Lattices.

In this section, we review the idea of lattice and nested lattices and introduce notation that will be used in our discussion.

For a set of n basis vectors $\{g_1, \ldots, g_n,\}$ in $R^n$, an unbounded n-dimensional (n-D) lattice $\Lambda$ is defined by $$\Lambda = \{l = Gi : i \in Z^n\} \quad (2)$$

and its generator matrix $$G = [g_1 | g_2 | \ldots | g_n].$$

R denotes the set of real numbers. $R^n$ denotes n-dimensional Euclidean space. Z denotes the set of integers. $Z^n$ denotes the Cartesian product of n copies of Z, i.e., the set of n-vectors whose components are integers.

The nearest neighbor quantizer $Q_\Lambda(x)$ associated with $\Lambda$ is given by $$Q_\Lambda(x) = \arg\min_{l \in \Lambda} \|x - l\|. \quad (3)$$

The notation "arg min" denotes the value of the argument (in this case l) where the minimum is achieved. Expression (3) is augmented with a set of "tie breaking" rules to decide the result in cases where two or more points of the lattice $\Lambda$ achieve the minimum distance to vector x. Any of various sets of tie breaking rules may be used. For example, in dimension one (i.e., n=1) with lattice $\Lambda$ being the integers, points of the form k+(½) with be equidistant to k and k+1. One possible tie-breaking rule would be to map such points up to k+1. In one set of embodiments, the nearest neighbor quantizer defined by (3) and a set of tie breaking rules has the property:

$$Q_\Lambda(x+l) = Q_\Lambda(x) + l, \forall l \in \Lambda.$$

The basic Voronoi cell of $\Lambda$, which specifies the shape of the nearest-neighbor decoding region, is $$K = \{x : Q_\Lambda(x) = 0\}. \quad (4)$$

Associated with the Voronoi cell K are several important quantities: the cell volume V, the second moment $\sigma^2$ and the normalized second moment $G(\Lambda)$, defined by $$V = \int_K dx, \quad (5)$$

$$\sigma^2 = \frac{1}{nV} \int_K |x|^2 \, dx, \quad (6)$$

$$G(\Lambda) = \frac{\sigma^2}{V^{2/n}}, \quad (7)$$

respectively. The minimum of $G(\Lambda)$ over all lattices in $R^n$ is denoted as $G_n$. By [13], $$G_n \geq \frac{1}{(2\pi e)}, \forall n \quad (8)$$

$$\lim_{n \to \infty} G_n = \frac{1}{(2\pi e)} \quad (9)$$

The notation "$\forall$" is to be read as "for all". The constant e is Euler's constant.

A pair of n-D lattices $(\Lambda_1, \Lambda_2)$ with corresponding generator matrices $G_1$ and $G_2$ is nested, if there exists an n×n integer matrix P such that $$G_2 = G_1 \times P \text{ and}$$

$$\det\{P\} > 1,$$

where $\det\{P\}$ denotes the determinant of the matrix P. In this case $V_2/V_1$ is called the nesting ratio, and $\Lambda_1$ and $\Lambda_2$ are called the fine lattice and coarse lattice, respectively.

For a pair $(\Lambda_1, \Lambda_2)$ of nested lattices, the points in the set $\Lambda_1/\Lambda_2 \equiv \{\Lambda_1 \cap K_2\}$ are called the coset leaders of $\Lambda_2$ relative to $\Lambda_1$, where $K_2$ is the basic Voronoi cell of $\Lambda_2$. The notation "A≡B" means that A is being defined by expression B, or vice versa. For each $v \in \Lambda_1/\Lambda_2$ the set of shifted lattice points $$C(v) \equiv \{v+l, \forall l \in \Lambda_1\}$$

is called a coset of $\Lambda_2$ relative to $\Lambda_1$. The $j^{th}$ point of C(v) is denoted as $c_j(v)$. Then $$C(0) = \{c_j(0), \forall j \in Z\} = \Lambda_2, \quad (10)$$

and $$\bigcup_{v \in \Lambda_1/\Lambda_2} C(v) = \Lambda_1. \quad (11)$$

Since $$c_j(v) \in \Lambda_1, \forall j \in Z, \quad (12)$$

we further define $$R_j(v) = \{x : Q_{\Lambda_1}(x) = c_j(v)\}$$

as the Voronoi region associated with $c_j(v)$ in $\Lambda_1$, and $R(v) = \bigcup_{j=-\infty}^{\infty} R_j(v)$. Then $$\bigcup_{v \in \Lambda_1/\Lambda_2} R_0(v) = K_2, \quad (13)$$

and $$\bigcup_{j=-\infty}^{\infty} \bigcup_{v \in \Lambda_1/\Lambda_2} R_j(v) = \bigcup_{v \in \Lambda_1/\Lambda_2} R(v) = R^n. \quad (14)$$

Figure 7:
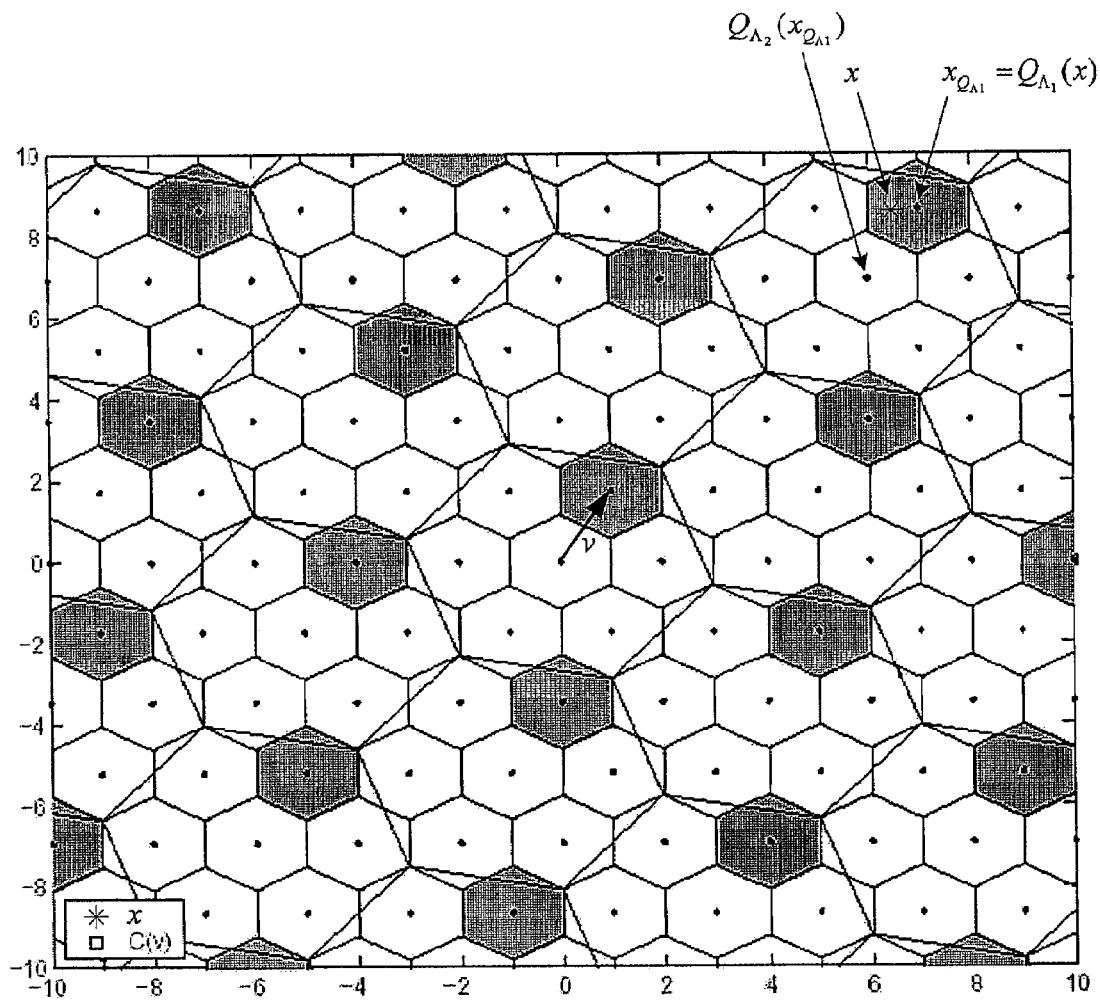
FIG. 7 illustrates an example of a fine lattice, coarse lattice, coset leader vector v and region R(v) in dimension n=2.

FIG. 7 illustrates examples of v, C(v) and R(v). The fine lattice points are at the centers of the small hexagons. The coarse lattice points are at the centers of the large hexagons. R(v) is the union of the shaded hexagons. The coset C(v) is the set composed of the centers of the shaded hexagons. The fine lattice and coarse lattice may be generated by $$G_1 = \begin{bmatrix} 2 & 1 \\ 0 & \sqrt{3} \end{bmatrix} \text{ and } G_2 = \begin{bmatrix} 5 & 1 \\ \sqrt{3} & 3\sqrt{3} \end{bmatrix},$$

respectively, and related by $$P = \begin{bmatrix} 2 & -1 \\ 1 & 3 \end{bmatrix}.$$

Nested Lattice Quantization.

Throughout this paper, we use the correlation model of X=Y+Z, where X, Y and Z are random vectors in $R^n$. X is the source to be coded, Y is the side information, and Z is the noise. Y and Z are independent. In this section we discuss the performance of nested lattice quantization for general sources where Y and Z are arbitrarily distributed with zero means, as well as for the quadratic Gaussian case where $Y_i \sim N(0, \sigma_Y^2)$ and $Z_i \sim N(0, \sigma_Z^2)$, i=1, 2, ..., n, are Gaussian. For both cases, the mean squared error (MSE) is used as the distortion measurement.

Zamir et al's nested lattice quantization scheme [18], [16] works as follows: Let the pseudo-random vector U (also referred to herein as the "dither"), known to both the quantizer encoder and the decoder, be uniformly distributed over the basic Voronoi cell $K_1$ of the fine lattice $\Lambda_1$. For a given target average distortion D, denote $\alpha = \sqrt{1 - D/\sigma_Z^2}$ as the estimation coefficient. Given the realizations of the source, the side information and the dither as x, y and u, respectively, then according to [18], the nested quantizer encoder quantizes $\alpha x + u$ to the nearest point $x_{Q_{\Lambda_1}} = Q_{\Lambda_1}(\alpha x + u)$ in $\Lambda_1$, computes $x_{Q_{\Lambda_1}} - Q_{\Lambda_2}(x_{Q_{\Lambda_1}})$ which is the coset shift of $x_{Q_{\Lambda_1}}$ with respect to $\Lambda_2$, and transmits the index corresponding to this coset shift.

The nested quantizer decoder receives the index, generates $x_{Q_{\Lambda_1}} - Q_{\Lambda_2}(x_{Q_{\Lambda_1}})$ from the index, forms $$w = x_{Q_{\Lambda_1}} - Q_{\Lambda_2}(x_{Q_{\Lambda_1}}) - u - \alpha y$$

and reconstructs x as $\hat{x} = y + \alpha(w - Q_{\Lambda_2}(w))$ using linear combination and dithering in estimation.

It is shown in [18] that the Wyner-Ziv R-D function $D_{WZ}(R) = \sigma_{X|Y}^2 2^{-2R}$ is achievable with infinite dimensional nested lattice quantization for quadratic Gaussian case. In this paper, we analyze the high-rate performance of low-dimensional nested lattice quantization, which is of more practical interest as high-dimensional nested lattice quantization is too complex to implement, for both general and Gaussian sources.

Our analysis is based on the high-resolution assumption, which means 1) $V_1$ is small enough so that the PDF of X, $f(x)$, is approximately constant over each Voronoi cell of $\Lambda_1$ and 2) dithering can be ignored. With the high-rate assumption, $\alpha \approx 1$ and the encoder/decoder described above simplifies as follows:

(1) The encoder quantizes x to $x_{Q_{\Lambda_1}} = Q_{\Lambda_1}(X)$, computes $v = x_{Q_{\Lambda_1}} - Q_{\Lambda_2}(x_{Q_{\Lambda_1}})$, and transmits an index corresponding to the coset leader v.

(2) Upon receiving v, the decoder forms w=v−y and reconstructs x as $\hat{x}_v = y + W - Q_{\Lambda_2}(w) = v + Q_{\Lambda_2}(y-v)$.

Figure 8:
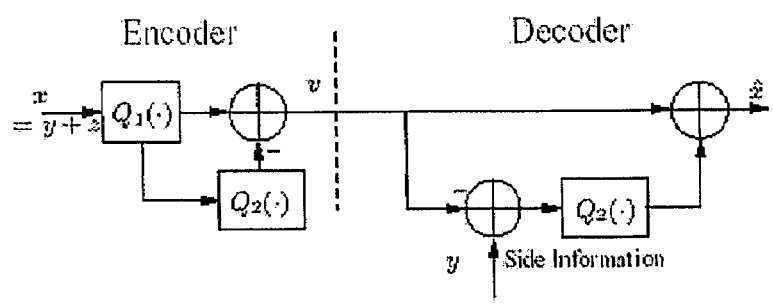
FIG. 8 illustrates a simplified nested quantization ender and decoder.

This simplified nested lattice quantization scheme for high rate is shown in FIG. 8 and was also used in [3].

A. High Rate Performance for General Sources with Arbitrary Distribution.

Theorem 4.1: If a pair of n-D nested lattices $(\Lambda_1, \Lambda_2)$ with nesting ratio $N = V_2/V_1$ is used for nested lattice quantization, the distortion per dimension in Wyner-Ziv coding of X with side information Y at high rate is $$D_n = G(\Lambda_1) V_1^{2/n} + \frac{1}{n} E_Z[\|Q_{\Lambda_2}(Z)\|^2]. \tag{15}$$

The notation $\|a\|$ denotes the length (or norm) of the vector a.

Proof: Since $$R^n = \bigcup_{j=-\infty}^{\infty} \bigcup_{v \in \Lambda_1/\Lambda_2} R_j(v), \tag{16}$$

the average distortion for a given realization of the side information Y=y is $$D(y) = \int_{R^n} f(x|y) \|x - \hat{x}_v\|^2 dx \tag{17}$$

$$= \sum_{v \in \Lambda_1/\Lambda_2} \sum_{j=-\infty}^{\infty} \int_{x \in R_j(v)} f(x|y) \|x - \hat{x}_v\|^2 dx$$

$$= \sum_{v \in \Lambda_1/\Lambda_2} \sum_{j=-\infty}^{\infty} \int_{x \in R_j(v)} f(x|y)$$

$$\|x - c_j(v) + c_j(v) - \hat{x}_v\|^2 dx$$

$$= \sum_{v \in \Lambda_1/\Lambda_2} \sum_{j=-\infty}^{\infty} \int_{x \in R_j(v)} f(x|y)$$

$$\begin{bmatrix} \|x - c_j(v)\|^2 + \\ \|c_j(v) - \hat{x}_v\|^2 + \\ 2 < x - c_j(v), c_j(v) - \hat{x}_v > \end{bmatrix} dx$$

$$\stackrel{(a)}{\approx} \sum_{v \in \Lambda_1/\Lambda_2} \sum_{j=-\infty}^{\infty} \begin{bmatrix} f(c_j(v)|y) \int_{x \in R_j(v)} \|x - c_j(v)\|^2 dx + \\ \int_{x \in R_j(v)} f(x|y) \|c_j(v) - \hat{x}_v\|^2 dx \end{bmatrix}$$

$$\stackrel{(b)}{=} \sum_{v \in \Lambda_1/\Lambda_2} \sum_{j=-\infty}^{\infty} \begin{bmatrix} f(c_j(v)|y) n G(\Lambda_1) V_1^{1+(2/n)} + \\ \int_{x \in R_j(v)} f(x|y) \|Q_{\Lambda_2}(c_j(v)) - \\ Q_{\Lambda_2}(y - c_j(v)) + \\ Q_{\Lambda_2}(c_j(v))\|^2 dx \end{bmatrix}$$

$$\stackrel{(c)}{\approx} n G(\Lambda_1) V_1^{\frac{2}{n}} + \sum_{j=-\infty}^{\infty} \sum_{v \in \Lambda_1/\Lambda_2} \int_{x \in R_j(v)}$$

$$f(x|y) \|Q_{\Lambda_2}(x - y)\|^2 dx$$

$$= n G(\Lambda_1) V_1^{\frac{2}{n}} + \int_{x \in R^n} f(x|y)$$

$$\|Q_{\Lambda_2}(x - y)\|^2 dx,$$

where (a) comes from the high rate assumption and $$\int_{x \in R_j(v)} <x - c_j(v), c_j(v) - \hat{x}_v > dx = 0. \tag{18}$$

The latter is due to the fact that $x - c_j(v)$ is odd spherical symmetric for $x \in R_j(v)$ and both $c_j(v)$ and $\hat{x}_v$ are fixed for $x \in R_j(v)$ with given v and y. (b) is due to $c_j(v) = Q_{\Lambda_1}(x)$ for $x \in R_j(v)$, and $$\hat{x}_v = c_j(v) - Q_{\Lambda_2}(c_j(v)) + Q_{\Lambda_2}(y - c_j(v) + Q_{\Lambda_2}(c_j(v))); \tag{19}$$

and (c) is due to $$Q_{\Lambda_2}(a + Q_{\Lambda_2}(b)) = Q_{\Lambda_2}(a) + Q_{\Lambda_2}(b), \forall a, b \in R^n \tag{20}$$

and the high resolution assumption.

Therefore, the average distortion per dimension over all realizations of Y is $$D_n = \frac{1}{n} E_Y[D(y)] \tag{21}$$

$$= G(\Lambda_1) V_1^{2/n} + \frac{1}{n} \int_x \int_y f(x, y) \|Q_{\Lambda_2}(x-y)\|^2 dx dy$$

$$= G(\Lambda_1) V_1^{2/n} + \frac{1}{n} \int_y f(y) \int_z f(z) \|Q_{\Lambda_2}(z)\|^2 dz dy$$

$$= G(\Lambda_1) V_1^{2/n} + \frac{1}{n} E_Z[\|Q_{\Lambda_2}(z)\|^2].$$

Remarks: There are several interesting facts about this rate-distortion function. 1) For a fixed pair of the nested lattices $(\Lambda_1, \Lambda_2)$, $D_n$ only depends on Z, i.e., the correlation between X and Y. $D_n$ is independent of the marginal distribution of X (or Y). 2) The first term, $G(\Lambda_1) V_1^{2/n}$, in the expression for $D_n$ is due to lattice quantization in source coding. It is determined by the geometric structure and the Voronoi cell volume $V_1$ of lattice $\Lambda_1$. The second term, $$\frac{1}{n} E_Z[\|Q_{\Lambda_2}(z)\|^2],$$

is the loss due to nesting (or the channel coding component of the nested lattice code). The second term depends on Voronoi cell volume $V_2$ and the distribution of Z. From another point of view, the first term is the granular component $MSE_g$ with respect to the granular lattice $\Lambda_1$, and the second term is the overload component $MSE_{ol}$ with respect to the lattice $\Lambda_2$ of the nested quantizer. $MSE_g = G(\Lambda_1) V_1^{2/n}$ is the same as the granular MSE for non-nested lattice quantizer [19].

Corollary 4.1: For the quadratic case, $D_n \to D_{WZ} = \sigma_{X|Y}^2 2^{-2R}$ as $n \to \infty$.

Proof: Since the nested lattice quantizer is a fixed-rate quantizer with the rate $$R = \frac{1}{n}\log\left(\frac{V_2}{V_1}\right),$$

then (21) can be rewritten as $$D_n = G(\Lambda_1)V_2^{2/n}2^{-2R} + \frac{1}{n}E_Z[\|Q_{\Lambda_2}(z)\|^2]. \quad (22)$$

For the quadratic Gaussian case, according to equation (3.14) of [18], $$\frac{1}{n}\log(V_2) \approx \frac{1}{2}\log(2\pi e \sigma_Z^2) \quad (23)$$

when n is sufficiently large, where $\sigma_Z^2 = \sigma_{X|Y}^2$ is the variance of the AWGN Z. Then $$G(\Lambda_1)V_2^{2/n}2^{-2R} \to \frac{1}{2\pi e}2\pi e \sigma_Z^2 2^{-2R} \quad (24)$$
$$= \sigma_Z^2 2^{-2R} = D_{WZ}.$$

At the same time, according to equation (3.12) of [18], $P_e = Pr\{Z \notin K_2\} < \epsilon$, with any $\epsilon > 0$ and sufficiently large n, hence $$\frac{1}{n}E_Z[\|Q_{\Lambda_2}(z)\|^2] \to 0 \text{ as } n \to \infty.$$

Consequently, the performance becomes $$D_n = G(\Lambda_1)V_2^{2/n}2^{-2R} + \frac{1}{n}E_Z[\|Q_{\Lambda_2}(z)\|^2] \quad (25)$$
$$\to \sigma_{X|Y}^2 2^{-2R} = D_{WZ}.$$

as $n \to \infty$, for the quadratic Gaussian case. This limit agrees with the statement in [18], which claims that the nested lattice quantization can achieve the Wyner-Ziv limit asymptotically as the dimensionality goes to infinity.

B. A Lower Bound of the Performance for Quadratic Case.

The source-coding-loss in (21) has an explicit form, while the channel-coding loss is not so directly expressed. Among all the possible patterns of the additive channels, AWGN is of most interest. In such case Z is a Gaussian variable with zero mean and variance $\sigma_Z^2 = \sigma_{X|Y}^2$. From Theorem 4.1, we obtain a lower bound of the high-rate R-D performance of low-dimensional nested lattice quantizers for Wyner-Ziv coding, when Z is Gaussian, stated as the following corollary.

Corollary 4.2: For $X=Y+Z$, $Y \sim N(0,\sigma_Y^2)$ and $Z \sim N(0,\sigma_Z^2)$, the R-D performance of Wyner-Ziv coding for X with side information Y using n-D nested lattice quantizers is lower-bounded at high rate by $$D_n(R) \geq \overline{D}_n(R) \equiv \min_{V_2 > 0} \delta_n(R), \quad (26)$$

where $$\delta_n(R) \equiv \quad (27)$$
$$G_n V_2^{2/n}2^{-2R} + \frac{1}{n}\sum_{j=1}^{\infty}((2j-1)\gamma_n V_2^{2/n})u\left(\frac{j^2 V_2^{2/n}\Gamma\left(\frac{n}{2}+1\right)^{2/n}}{2\pi\sigma_Z^2}\right),$$

$\gamma_n$ is the n-D Hermite's constant [13], [26], and u(t) is defined in [26] as $$u(t) = \begin{cases} e^{-t}\left(1 + \frac{t}{1!} + \frac{t^2}{2!} + K + \frac{t^{\frac{n}{2}-1}}{\left(\frac{n}{2}-1\right)!}\right) & \text{if } n \text{ is even} \\ e^{-t}\left(1 + \frac{t^{1/2}}{(1/2)!} + \frac{t^{3/2}}{(3/2)!} + \Lambda + \frac{T^{\frac{n}{2}-1}}{\left(\frac{n}{2}-1\right)!}\right) & \text{if } n \text{ is odd} \end{cases}. \quad (28)$$

Specifically, when n=1, the best possible high rate performance is $$D_1(R) = \min_{V_2 > 0}\left\{G_1 V_2^2 2^{-2R} + V_2^2 \sum_{j=0}^{\infty}(2j+1)Q\left(\frac{V_2}{\sigma_Z}\left(j+\frac{1}{2}\right)\right)\right\}, \quad (29)$$

where $$Q(t) = \frac{1}{\sqrt{2\pi}}\int_t^{\infty}e^{-\tau^2/2}d\tau. \quad (30)$$

Proof: 1) Rate Computation: Note that the nested lattice quantizer is a fixed rate quantizer with rate $$R = \frac{1}{n}\log_2\left(\frac{V_2}{V_1}\right).$$

2) Distortion computation: Define $$L_2 = \frac{1}{2}\min_{\forall l, l' \in \Lambda_2, l \neq l'}\|l - l'\|, \quad (31)$$

and $$P_Z(L) = Pr(\|Z\| > L). \quad (32)$$

For the 1-D (scalar) case, $P_Z$ can be expressed in terms of the Q function and $E_Z[\|Q_{\Lambda_2}(z)\|^2]$ simplifies to [27]

$$E_Z[\|Q_{\Lambda_2}(z)\|^2] = V_2^2\sum_{j=0}^{\infty}(2j+1)Q\left(\frac{V_2}{\sigma_Z}\left(j+\frac{1}{2}\right)\right). \quad (33)$$

For the n-D (with n>1) case, note that [28]

$$L_2^2 = \gamma(\Lambda_2)V(\Lambda_2)^{2/n}, \quad (34)$$

and $$\|Q_{\Lambda_2}(z)\|^2 \geq \|z\|^2 - \|z - Q_{\Lambda_2}(z)\|^2 \geq \|z\|^2 - L_2^2, \quad (35)$$

where $\gamma(\Lambda_2)$ is the Hermite's constant of lattice $\Lambda_2$ [13], [26]. Then we get $$E_Z[\|Q_{\Lambda_2}(z)\|^2] = \sum_{j=1}^{\infty} \int_{((j-1)L_2 < \|z\| \leq jL_2)} f(z) \|Q_{\Lambda_2}(z)\|^2 \, dz \geq \quad (36)$$

$$\sum_{j=1}^{\infty} \int_{((j-1)L_2 < \|z\| \leq jL_2)} f(z)(\|z\|^2 - L_2^2) \, dz \geq$$

$$\sum_{j=1}^{\infty} \int_{((j-1)L_2 < \|z\| \leq jL_2)} f(z)((j-1)^2 L_2^2 - L_2^2) \, dz$$

$$= \sum_{j=1}^{\infty} ((j-1)^2 L_2^2 - L_2^2)[P_Z((j-1)L_2) - P_Z(jL_2)]$$

$$= \sum_{j=1}^{\infty} ((2j-1)L_2^2) P_Z(jL_2)$$

$$= \sum_{j=1}^{\infty} \left[ (2j-1)\gamma(\Lambda_2) V_2^{\frac{2}{n}} \right] P_e \left( \frac{j^2 V_2^{\frac{2}{n}} \Gamma\left(\frac{n}{2}+1\right)^{\frac{2}{n}}}{2\pi\sigma_Z^2} \right),$$

where $$\Gamma(t) = \int_0^\infty u^{t-1} e^{-u} \, du$$

is Euler's gamma function, and $P_e(\cdot)$ is defined in [26] as the symbol error probability under maximum likelihood decoding while transmitting the lattice points over an AWGN channel. A lower bound of $P_e(\cdot)$ was also given in [26] as $P_e(t) \geq u(t)$.

Then Theorem 4.1 and (36) give $$D_n \geq \delta_n \equiv G_n V_1^{2/n} + \frac{1}{n} \sum_{j=1}^{\infty} ((2j-1)\gamma_n V_2^{2/n}) u\left( \frac{j^2 V_2^{2/n} \Gamma\left(\frac{n}{2}+1\right)^{2/n}}{2\pi\sigma_Z^2} \right). \quad (37)$$

Using $$R = \frac{1}{n} \log_2\left(\frac{V_2}{V_1}\right),$$

we eliminate $V_1$ in $D_n$ and obtain a lower bound on $D_n(R)$ as $$D_n(R) \geq \overline{D}_n(R) \equiv \min_{V_2 > 0} \delta_n(R), \quad (38)$$

where $$\delta_n(R) = G_n V_2^{2/n} 2^{-2R} + \frac{1}{n} \sum_{j=1}^{\infty} ((2j-1)\gamma_n V_2^{2/n}) u\left( \frac{j^2 V_2^{2/n} \Gamma\left(\frac{n}{2}+1\right)^{2/n}}{2\pi\sigma_Z^2} \right). \quad (39)$$

Figure 9:
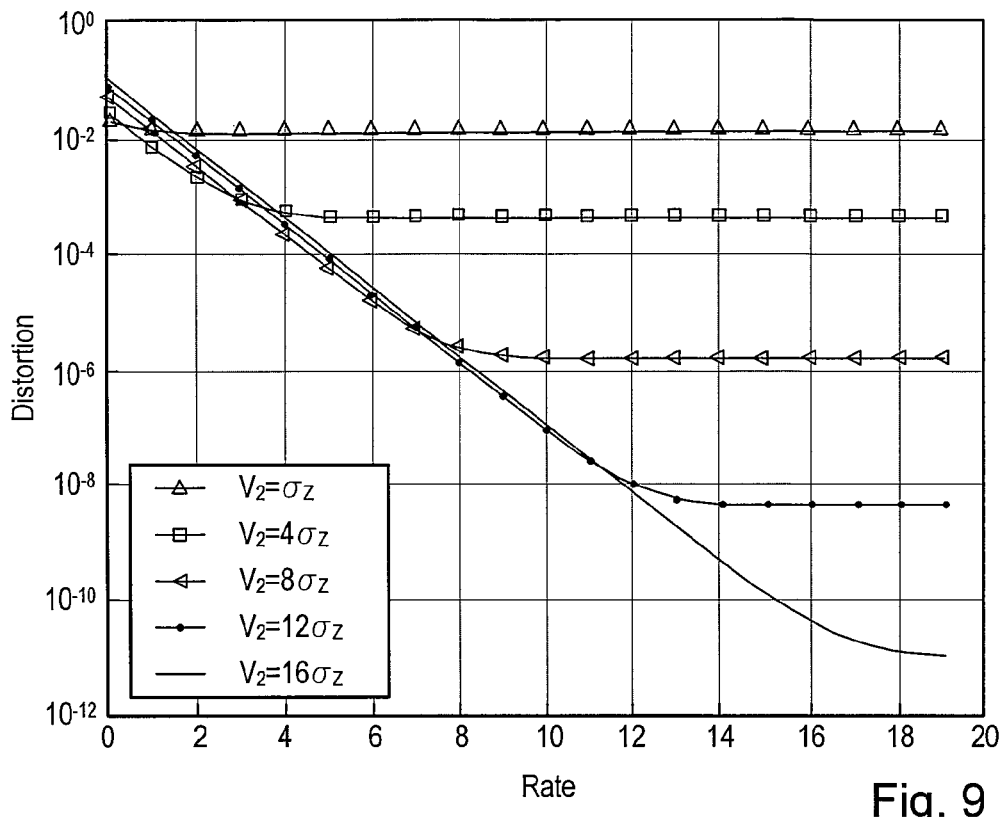
FIG. 9 shows $\delta_2(R)$ with different $V_2$'s using nested $A_2$ lattices (i.e., hexagonal lattices) in dimension n=2.
Figure 10:
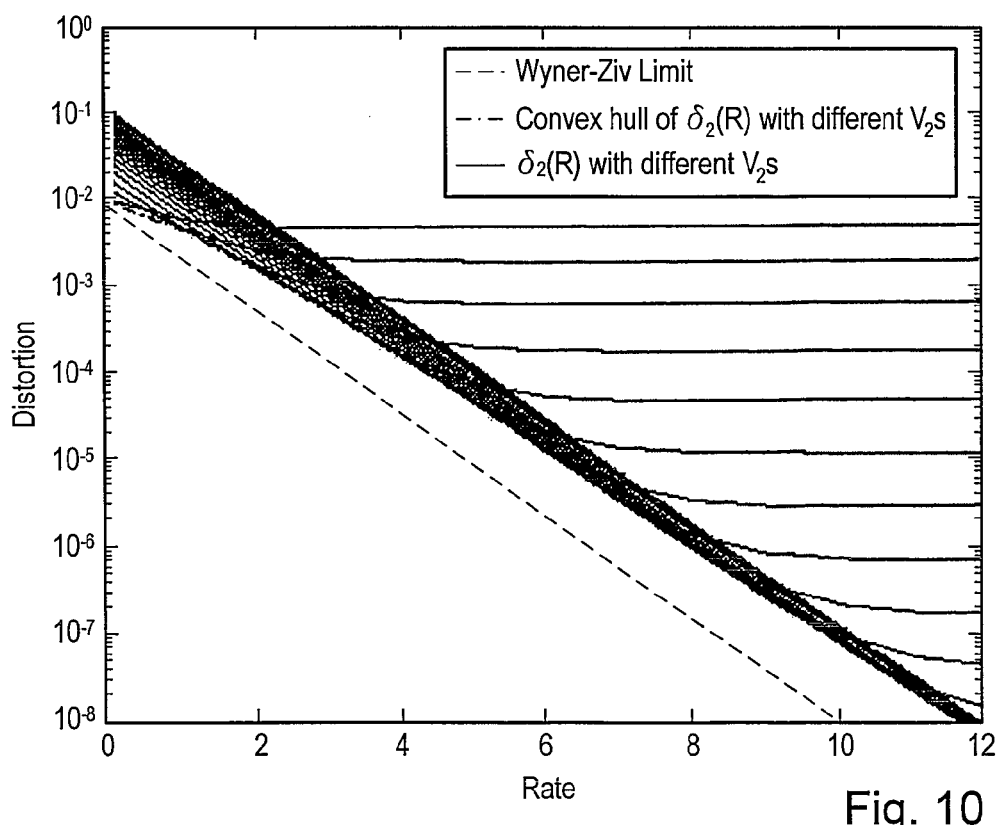
FIG. 10 shows $\overline{D}_2(R)$ as the convex hull of $\delta_2(R)$ with different $V_2$.

FIG. 9 shows $\delta_2(R)$ with different $V_2$'s using nested $A_2$ lattices (i.e., hexagonal lattices) in 2-D with $\sigma_Z^2 = 0.01$. The lower bound $\overline{D}_2(R)$ is the lower convex hull of all operational R-D points with different $V_2$, as shown in FIG. 10. We observe from FIG. 10 that the gap from $\overline{D}_n(R)$ to $D_{WZ}(R)$ in dBs keeps increasing as the rate increases with $\sigma_Z^2 = 0.01$. This increasing gap comes from the fact that, the granular MSE component $$MSE_g \equiv G_n V_1^{2/n} = \frac{1}{12\gamma_g} \left(\frac{V_2}{N}\right)^{2/n} = \frac{1}{12\gamma_g} V_2^{2/n} 2^{-2R}$$

is away from the benchmark $2^{-2R}$ with an increasing gap as $V_2$ increases, where $$\gamma_g \equiv \frac{1/12}{G_n}$$

is the granular gain [19] of lattice $\Lambda_1$, and $$R = \frac{1}{n} \log N,$$

Figure 11:
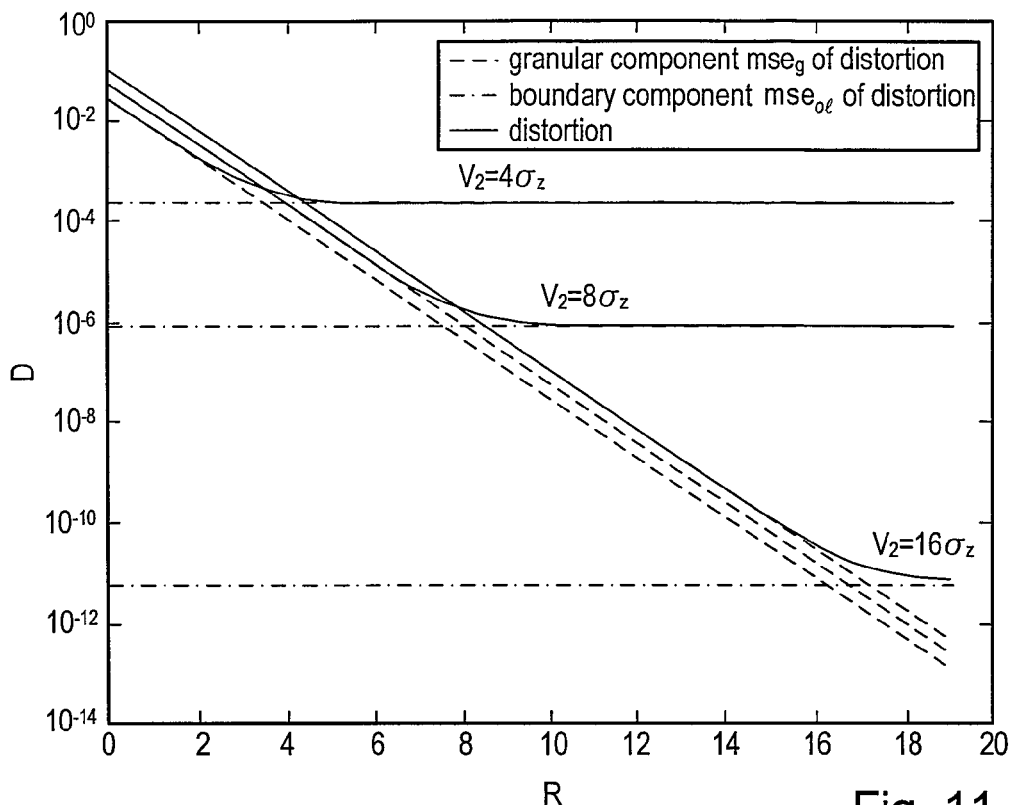
FIG. 11 shows the granular and boundary components of distortion with different $V_2$'s.

N is the nesting ratio, as shown in FIG. 11.

Figure 12:
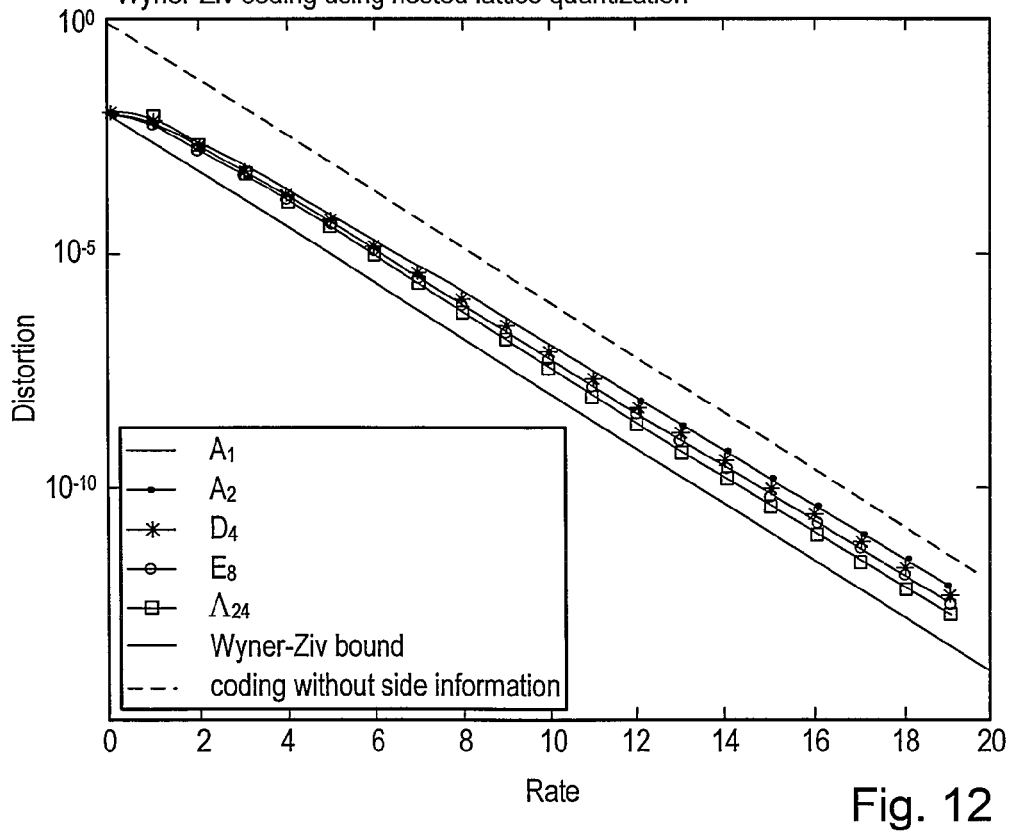
FIG. 12 plots $\overline{D}_n(R)$ for n=1, 2, 4, 8 and 24 with $\sigma_Z^2=0.01$.

FIG. 12 plots $\overline{D}_n(R)$ for n=1, 2, 4, 8 and 24 with $\sigma_Z^2 = 0.01$. We see that $\overline{D}_n(R)$ gets closer and closer to the Wyner-Ziv R-D function $D_{WZ}(R) = \sigma_{X|Y}^2 2^{-2R}$ as n goes to infinity.

C. Discussion of the Correlation-Asymptotical Property.

As to the asymptotical property of the nested-lattice quantization for Wyner-Ziv coding, we have the following statement. Here asymptotical means that the correlation $$\rho \equiv \frac{E[XY]}{\sqrt{E[X^2]E[Y^2]}}$$

between the source X and the side information Y goes to 1 asymptotically. If we fix $\sigma_Y^2$, then the asymptotical performance is the one when $\sigma_Z^2 \to 0$.

Corollary 4.3: The distortion of the nested lattice quantization maintains a constant gap (in dB) to the Wyner-Ziv bound for all $0 < \sigma_Z^2 < 1$.

Proof: Denote $$s = V_2^{2/n}, \quad t = \frac{j^2 \Gamma\left(\frac{n}{2}+1\right)^{2/n}}{2\pi\sigma_Z^2} s,$$

From Corollary 4.1, we get $$\delta = G_n s 2^{-2R} + \frac{1}{n} \sum_{j=1}^{\infty} ((2j-1)\gamma_n s) u(t). \quad (40)$$

Fix rate R and dimensionality n (without loss of generality, assume n is even), and minimize $\delta$ with respect to s, $$\frac{d\delta}{ds} = G_n 2^{-2R} + \frac{1}{n}\sum_{j=1}^{\infty}((2j-1)\gamma_n u(t)) + \frac{1}{n}\sum_{j=1}^{\infty}\left((2j-1)\gamma_n t \frac{du(t)}{dt}\right) \quad (41)$$

where $$\frac{du(t)}{dt} = -e^{-t}\left(1 + \frac{t}{1!} + K + \frac{t^{\frac{n}{2}-1}}{\left(\frac{n}{2}-1\right)!}\right) +$$

$$e^{-t}\left(1 + \frac{t}{1!} + K + \frac{t^{\frac{n}{2}-2}}{\left(\frac{n}{2}-2\right)!}\right) \quad (42)$$

$$= -e^{-t}\frac{t^{\frac{n}{2}-1}}{\left(\frac{n}{2}-1\right)!}$$

then $$\frac{d\delta}{ds} G_n 2^{-2R} + \frac{1}{n}\sum_{j=1}^{\infty}((2j-1)\gamma_n u(t)) - \frac{1}{n}\sum_{j=1}^{\infty}\left((2j-1)\gamma_n t e^{-t}\frac{t^{(n/2)-1}}{\left(\frac{n}{2}-1\right)!}\right). \quad (43)$$

Set $$\frac{d\delta}{ds} = 0,$$

and denote the optimal s as $s_0$, and denote the corresponding t as $$t_0 = \frac{j^2 A}{2\pi\sigma_z^2} s_0,$$

we get $$G_n 2^{-2R} + \frac{1}{n}\sum_{j=1}^{\infty}((2j-1)\gamma_n u(t_0)) = \quad (44)$$

$$\frac{1}{n}\sum_{j=1}^{\infty}\left((2j-1)\gamma_n t_0 e^{-t_0}\frac{t_0^{(n/2)-1}}{\left(\frac{n}{2}-1\right)!}\right), \text{ hence}$$

$$\delta^* = G_n s_0 2^{-2R} + \frac{1}{n}\sum_{j=1}^{\infty}((2j-1)\gamma_n s_0 u(t_0)) \quad (45)$$

$$= \frac{1}{2}\sum_{j=1}^{\infty}\left((2j-1)\gamma_n s_0 t_0 e^{-t_0}\frac{t_0^{(n/2)-1}}{\left(\frac{n}{2}-1\right)!}\right)$$

$$= \frac{1}{n}\sum_{j=1}^{\infty}\left((2j-1)\gamma_n \frac{2\pi\sigma_z^2}{j^2 A}t_0^2 e^{-t_0}\frac{t_0^{(n/2)-1}}{\left(\frac{n}{2}-1\right)!}\right).$$

From (45) one can see that the optimal t0 only depends on the rate R and the dimensionality n. The optimal $t_0$ stays unchanged with different $\sigma_z^2$, thus the optimized distortion $\delta^*$ is a linear function of $\sigma_z^2$, denoted as $D=\delta^*=B(R,n)\sigma_z^2$. Since the Wyner-Ziv bound is $D_{WZ}=\sigma_z^2 2^{-2R}$, the gap (in terms of dB) from the practical optimized distortion D to Wyner-Ziv bound $D_{WZ}$ with fixed R and n is $$\Delta D = 10\log_{10}\frac{D}{D_{WZ}} = 10\log_{10}\frac{B(R,n)}{2^{-2R}} \quad (46)$$

which stays constant for all $\sigma_z^2 < 1$.

This result verifies our simulation results which show that the distortion of the nested lattice quantizer does NOT approach the Wyner-Ziv bound as the correlation between the source and the side information goes to 1 asymptotically.

Slepian-Wolf Coded Nested Lattice Quantization (SWC-NQ).

In this section, we evaluate the boundary gain of the source coding component of nested lattice quantization. Motivated by this evaluation, we introduce SWC-NQ and analyze its performance.

A. Motivation of SWC-NQ.

From Theorem 4.1, the distortion per dimension of the nested lattice quantizer is $D_n = MSE_g + MSE_{ol}$, where $MSE_g = G(\Lambda_1)V_1^{2/n}$ is the granular component of the distortion, characterized by the granular gain $$\gamma_g(\Lambda_1) = \frac{1/12}{G(\Lambda_1)},$$

while $$MSE_{ol} = \frac{1}{n}E_z[\|Q_{\Lambda_2}(z)\|^2]$$

is the overload component of the distortion, characterized by the boundary gain $\gamma_b(\Lambda_2)$. The boundary gain $\gamma_b(\Lambda_2)$ is defined in [19] as follows. Suppose that $\Lambda_2$ is the boundary (coarse) lattice with its Voronoi region as the n-dimensional support region, and it has the same overload probability as a cubic support region of size $\alpha M$ centered at the origin. The boundary gain is then defined as the ratio of the normalized volume $(\alpha M)^2$ of the cubic support region to the normalized volume $V_2^{2/n}$, as $$\gamma_b(\Lambda_2) = \frac{(\alpha M)^2}{V_2^{2/n}}. \quad (47)$$

Since $$MSE_g = G(\Lambda_1)V_1^{2/n} \quad (48)$$

$$= \frac{1}{12\gamma_g(\Lambda_1)}V_2^{2/n}N^{-2/n}$$

$$= \frac{1}{12\gamma_g(\Lambda_1)}\frac{\alpha M}{\gamma_b(\Lambda_2)}N^{-2/n}$$

If the nesting ratio N stays constant (i.e., the codebook size N stays constant), then $MSE_g$ will be reduced by a factor of $\gamma_b(\Lambda_2)$, without affecting $MSE_{ol}$ because the overload probability stays unchanged.

To increase the boundary gain $\gamma_b(\Lambda_2)$, a second-stage of binning can be applied to the quantization indices. The essence of binning is a channel code which partitions the support region into several cosets. Assuming the channel code is strong enough so that there is no extra overload probability introduced (i.e., it is lossless coding for the indices without decoding error), and the channel code partitions the support region $K_2$ into m cosets, with the set composed of the coset leaders denoted as S, then #(S)=m and S is the support region for the quantization indices and hence the support region for the nested quantization, with $\text{Vol}(S)=(m/N)V_2<V_2$. Then the effective volume of the support region decreases by a factor of the coset size after the second stage of binning, and therefore, the boundary gain $\gamma_b(\Lambda_2)$ increases. The notation "#(A)" denotes the cardinality of (i.e., the number of elements in) the set A.

We thus propose a framework for Wyner-Ziv coding of i.i.d. sources based on SWC-NQ, which involves nested quantization (NQ) and Slepian-Wolf coding (SWC). The SWC operates as the second binning scheme. Despite the fact that there is almost no correlation among the nested quantization indices that identify the coset leaders $v \in \Lambda_1/\Lambda_2$ of the pair of nested lattices $(\Lambda_1, \Lambda_2)$, there still remains correlation between v and the side information Y. Ideal SWC can be used to compress v to the rate of R=H(v|Y). State-of-the-art channel codes, such as LDPC codes, can be used to approach the Slepian-Wolf limit H(v|Y) [29]. The role of SWC in SWC-NQ is to exploit the correlation between v and Y for further compression.

B. Uniform High Rate Performance.

Let's evaluate the high rate performance for the quadratic Gaussian case first. For this case, a lower bound for the high-rate performance of SWC-NQ with a pair of arbitrary nested lattices $(\Lambda_1, \Lambda_2)$ is given as $$D_n(R) \geq G(\Lambda_1) 2^{(2/n)h'(X,\Lambda_2)} \sigma_{X|Y}^2 2^{-2R} + \qquad (49)$$
$$\frac{1}{n} \sum_{j=1}^{\infty} ((2j-1)\gamma_n V_2^{2/n}) u\left( \frac{j^2 V_2^{2/n} \Gamma\left(\frac{n}{2}+1\right)^{2/n}}{2\pi\sigma_Z^2} \right)$$

where $$h'(X, \Lambda_2) \equiv -\int_{x \in R^n} \overline{f}(x) \log_2 \left[ \sum_{i=-\infty}^{\infty} \overline{f}\left(x + \frac{c_i(0)}{\sigma_{X|Y}}\right) \right] dx, \qquad (50)$$

$\overline{f}(\cdot)$ is the PDF of an n-D i.i.d. Gaussian source with 0 mean and unit variance, u(t) is defined in (28), and $c_i(0)$ is defined above (in the section entitled "Lattices and Nested Lattices"), as the lattice points of $\Lambda_2$.

Proof: The proof to this lower bound is provided later.

Figure 13:
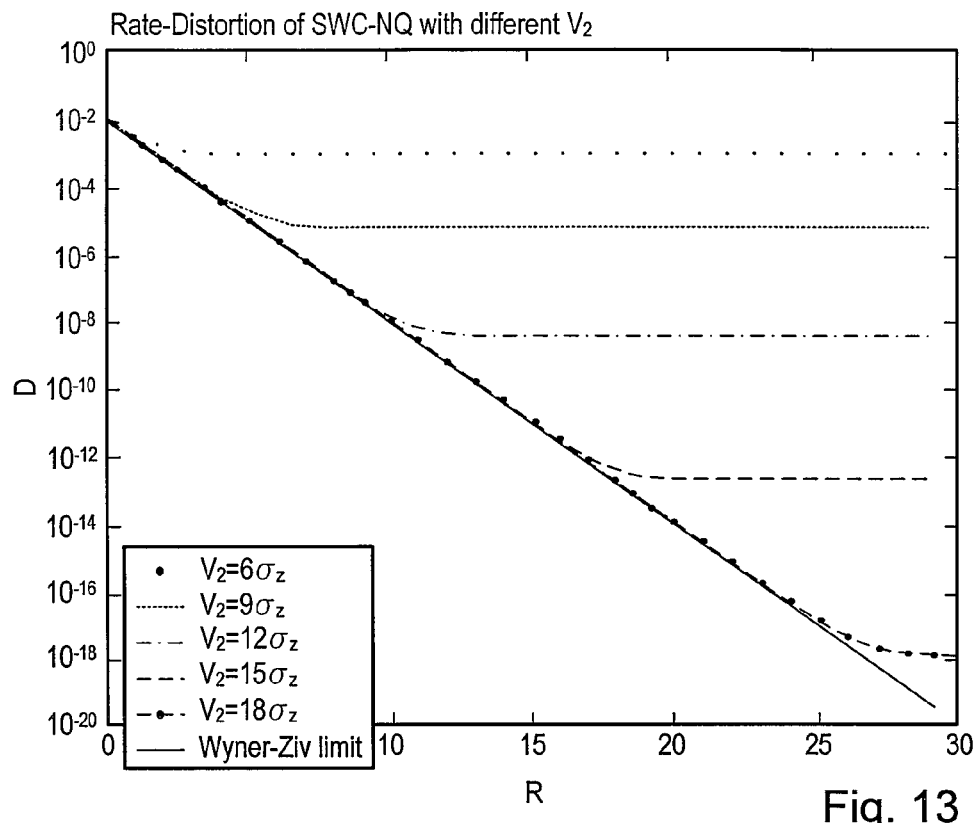
FIG. 13 shows the lower bound of D(R) with different $V_2$'s in the 1-D case.

For example, the lower bounds of D(R) for the 1-D case with different $V_2$ are plotted in FIG. 13.

FIG. 13 gives us a hint that, intuitively, the best R-D function of SWC-NQ is the R-D function as if the side information were also available at the encoder, and maintains a constant gap of $2\pi e G_n$ from the Wyner-Ziv limit in dB. Here the best means that, for a given distortion D, the minimal achievable rate R over all possible $V_2$, or equivalently, the minimal achievable distortion D over all possible $V_2$ for a given rate R. This claim is stated and proved as follows. Let's start with the following lemma and then prove the main theorem.

Lemma 5.1: For nested lattice quantization, denote $W \equiv Q_{\Lambda_1}(X)$, and $V \equiv W - Q_{\Lambda_2}(W)$. At high rate, $H(V|Y) \approx H(W|Y)$.

Proof: The proof is provided later.

Theorem 5.2: The optimal R-D performance of SWC-NQ for general sources using low-dimensional nested lattices for Wyner-Ziv coding at high rate is $$D_n^*(R) \equiv \min_{V_2} D(R) = G_n 2^{(2/n)h(X|Y)} 2^{-2R}. \qquad (51)$$

Proof: 1) When $V_2 \to \infty$, $Q_{\Lambda_2}(Q_{\Lambda_1}(X))=0$ and $Q_{\Lambda_2}(Z)=0$, then $$nR = H(V|Y) \qquad (52)$$
$$= H(Q_{\Lambda_1}(X) - Q_{\Lambda_2}(Q_{\Lambda_1}(X))|Y)$$
$$= H(Q_{\Lambda_1}(X)|Y)$$
$$= h(X|Y) - \log(V_1)$$

and $D_n(R) = G_n V_1^{2/n}$. Combine R and $D_n$ through $V_1$ and we get the R-D function as $$D_n(R)_{V_2 \to \infty} = G_n 2^{(2/n)h(X|Y)} 2^{-2R}. \qquad (53)$$

Since $D_n^*(R) \equiv \min_{V_2} D(R) \leq D_n(R)_{V_2 \to \infty}$, $\qquad (54)$ then $D_n^*(R) \leq G_n 2^{(2/n)h(X|Y)} 2^{-2R}$.

2) Denote $w \equiv Q_{\Lambda_1}(x)$, and $S_1 \equiv \{(x,\hat{x}): E[d(x,\hat{x})] \leq D\}$. The rate of Wyner-Ziv coding with respect to a given distortion D is [1]

$$nR^*(D) = \min_{p(v), p(\hat{x}|v,y),(x,\hat{x}) \in S_1} I(X;V|Y) \qquad (55)$$
$$\stackrel{(a)}{=} \min_{p(v), p(\hat{x}|v,y),(x,\hat{x}) \in S_1} H(V|Y)$$
$$\stackrel{(b)}{\approx} \min_{p(v), p(\hat{x}|v,y),(x,\hat{x}) \in S_1} H(W|Y),$$

where (a) comes from H(V|X,Y)=0 and (b) comes from Lemma 5.1.

Define $S_2 \equiv \{(x,\hat{x}) E[d(x,w)] \leq D\}$. From Theorem 4.1, $$E[d(x,\hat{x})] = G_n V_1^{2/n} + \frac{1}{n} E_Z[\|Q_{\Lambda_2}(z)\|^2] \qquad (56)$$
$$= E[d(x,w)] + \frac{1}{n} E_Z[\|Q_{\Lambda_2}(z)\|^2] \geq$$
$$E[d(x,w)].$$

Then $\forall (x,\hat{x}) \in S_1$, $$D \geq E[d(x,\hat{x})] \geq E[d(x,w)], \qquad (57)$$

it means that $(x,\hat{x}) \in S_2$.

Then $S_1 \subseteq S_2$, and $$nR^*(D) \approx \min_{p(v), p(\hat{x}|v,y),(x,\hat{x}) \in S_1} H(W|Y) \geq \min_{p(v), p(\hat{x}|v,y),(x,\hat{x}) \in S_2} H(W|Y). \qquad (58)$$

Since $H(W|Y)=h(X|Y)-\log(V_1)$ and $E[d(x,\hat{x})|Y]=G_n V_1^{2/n}$, $R^*(D)$ can be calculated using Lagrangian method, as $$nR^*(D) \geq \min_{p(v),p(\hat{x}|v,y),(x,\hat{x})\in S_2} H(W|Y) = h(X|Y) - \frac{n}{2}\log\left(\frac{D}{G_n}\right). \quad (59)$$

Then $$D_n^*(R) \geq G_n 2^{(2/n)h(X|Y)} 2^{-2R}. \quad (60)$$

From (54) and (60), it is proved that, at high rate, the best R-D function of SWC-NQ using low-dimensional lattices is $$D_n^*(R) = G_n 2^{(2/n)h(X|Y)} 2^{-2R}. \quad (61)$$

Corollary 5.4: The optimal R-D performance of quadratic Gaussian SWC-NQ using low-dimensional nested lattices at high rate is $$D_n^*(R) = G_n 2^{(2/n)h(X|Y)} 2^{-2R}. \quad (62)$$

We thus conclude that at high rates, SWC-NQ performs the same as the traditional entropy-constrained lattice quantization with the side information available at both the encoder and decoder. Specifically, the R-D functions with 1-D (scalar) lattice and 2-D (hexagonal) lattice are 1.53 dB and 1.36 dB away from the Wyner-Ziv bound, respectively.

Figure 14:
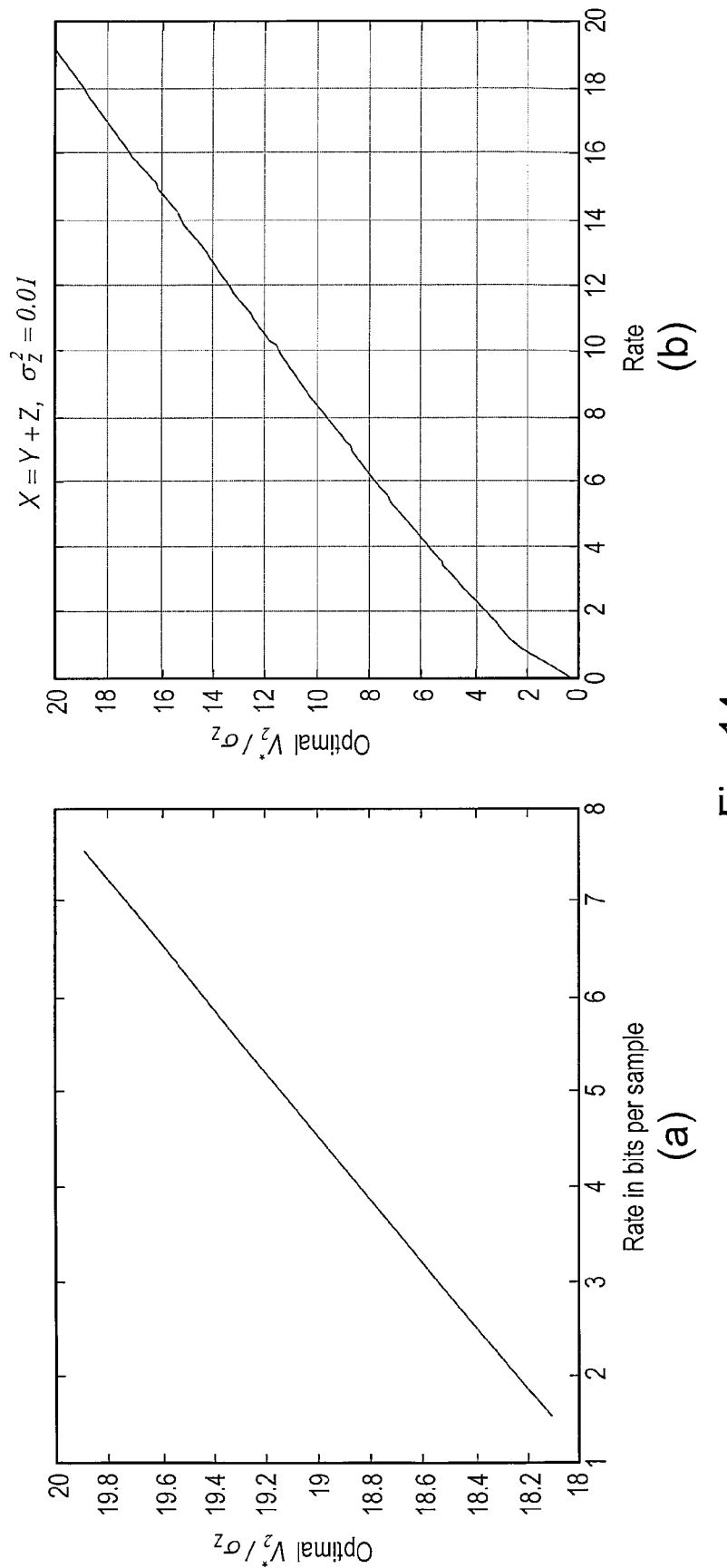
FIGS. 14(a) and (b) plot the optimal $V_2^*$ (scaled by $\sigma_Z$) as a function of R for the 1-D (n=1) and 2-D (n=2) cases.

Remarks: We found that for finite rate R and small n (e.g., n=1 and 2), the optimal $V_2$, denoted as $V_2^*$, that minimizes the distortion $D_n(R)$ is also finite. FIGS. 14(a) and (b) plot the optimal $V_2^*$ (scaled by $\sigma_Z$) as a function of R for the 1-D (n=1) and 2-D (n=2) case. We see that as R goes to infinity, $V_2^*$ also goes to infinity. We also observe that for fixed R and n, $D_n(R)$ stays roughly constant for $V_2 > V_2^*$.

Code Design and Simulation Results.

In this section, the optimal decoder for nested quantizer at low rate is introduced, and the issue of code design is also discussed, along with simulation results.

A. The Optimal Decoder for Nested Quantizer at Low Rate.

The optimal estimator for the decoder corresponding to the nested quantizer should minimize the distortion between X and the reconstructed $\hat{X}$. If mean squared error (MSE) is used as the distortion measure, $\hat{x}$ will be $E[X|j, y]$, where j is the received bin index corresponding to the coset leader $v = x_{Q_{\Lambda_1}} - Q_{\Lambda_2}(x_{Q_{\Lambda_1}})$. Let Y and Z be independent zero mean Gaussian random variables with variances $\sigma_Y^2$ and $\sigma_Z^2$, then we have $X|y \sim N(y, \sigma_Z^2)$.

When n=1, the optimal decoder for nested quantizer can be derived directly from $E[X|j,y]$ as $$\hat{x}(j,y) = \frac{1}{\sqrt{2\pi\sigma_Z^2}} \sum_{n=-\infty}^{\infty} \int_{jq+nQ}^{(j+1)q+nQ} x \exp\left(-\frac{\|x-y\|^2}{2\sigma_Z^2}\right) dx, \quad (63)$$

where q and Q are the uniform intervals of the two nested lattices used by the scalar quantizer, with $$\frac{Q}{q} = N,$$

where N is the nesting ratio. At high rates, the rate distortion performance using this non-linear estimation matches our analysis in (29); at low rate, such estimation method helps to boost the performance.

When n>1, the optimal decoder for the nested quantizer is stated as follows.

Theorem 6.3: The optimal decoder for the nested quantizer in the sense of MSE is $$\hat{x} = E[x|y, j] = \frac{\int_{R(v)} xf(x|y)dx}{\int_{R(v)} f(x|y)dx}. \quad (64)$$

Proof $$\hat{x} = E[x|y, j] \quad (65)$$

$$= \int_{R^n} xf(x|y, j) dx$$

$$= \int_{R^n} x \frac{f(x, j|y)}{P(j|y)} dx$$

$$= \frac{\int_{R^n} xf(x, j|y) dx}{P(j|y)}$$

$$= \frac{\int_{R^n} xf(x|y)P(j|x, y) dx}{\int_{R(v)} f(x|y) dx}.$$

Note that j, x, y form a Markov chain as $y \leftrightarrow x \leftrightarrow j$, then $$P(j|x, y) = P(j|x)\begin{cases} 0 \text{ if } x \notin R(v) \\ 1 \text{ if } x \in R(v) \end{cases}, \quad (66)$$

and we get $$\hat{x} = \frac{\int_{R^n} xf(x|y)P(j|x)dx}{\int_{R(v)} f(x|y)dx} \quad (67)$$

$$= \frac{\int_{R(v)} xf(x|y)dx}{\int_{R(v)} f(x|y)dx}.$$

Estimation at the decoder plays an important role for low-rate implementation. We thus apply an optimal non-linear estimator at the decoder at low rates in our simulations.

Corollary 6.5: The optimal estimator stated in Theorem 6.3 degenerates to the linear one $\hat{x} = v + Q_{\Lambda_2}(y-v)$ at high rates as we discussed above in the section entitled "Nested Lattice Quantization" and in the section entitled "Slepian-Wolf Coded Nested Lattice Quantization".

Proof: At high rate, $$\hat{x} = \frac{\int_{R(v)} xf(x|y)dx}{\int_{R(v)} f(x|y)dx} \quad (68)$$

$$= \frac{\sum_{i=-\infty}^{\infty} \int_{R_i(v)} xf(x|y)dx}{\sum_{i=-\infty}^{\infty} \int_{R_i(v)} f(x|y)dx}$$

-continued $$\overset{(a)}{\approx} \frac{\sum_{i=-\infty}^{\infty} c_i(v) \int_{R_i(v)} f(x|y)dx}{\sum_{i=-\infty}^{\infty} \int_{R_i(v)} f(x|y)dx}$$

$$\overset{(b)}{\approx} \frac{v + Q_{\Lambda_2}(y-v) \int_{K(v+Q_{\Lambda_2}(y-v))} f(x|y)dx}{\int_{K(v+Q_{\Lambda_2}(y-v))} f(x|y)dx}$$

$$= v + Q_{\Lambda_2}(y-v),$$

which is the linear estimator, discussed above in the section entitled "Nested Lattice Quantization" and in the section entitled "Slepian-Wolf Coded Nested Lattice Quantization", for high rate performance. Steps (a) and (b) of (68) come from the high rate assumption.

Since the non-linear estimation is a definite integral of a simple function over a disconnected region which includes many isolated Voronoi cells, we choose the Monte Carlo method to do this integral. In one simulation, for each scaling factor, there are totally $10^4 \times 10^4 = 10^8$ pairs of $\{x,y\}$ to be simulated, and for each pair of $\{x,y\}$, there are $10^4$ samples to calculate this definite integral.

Figure 15:
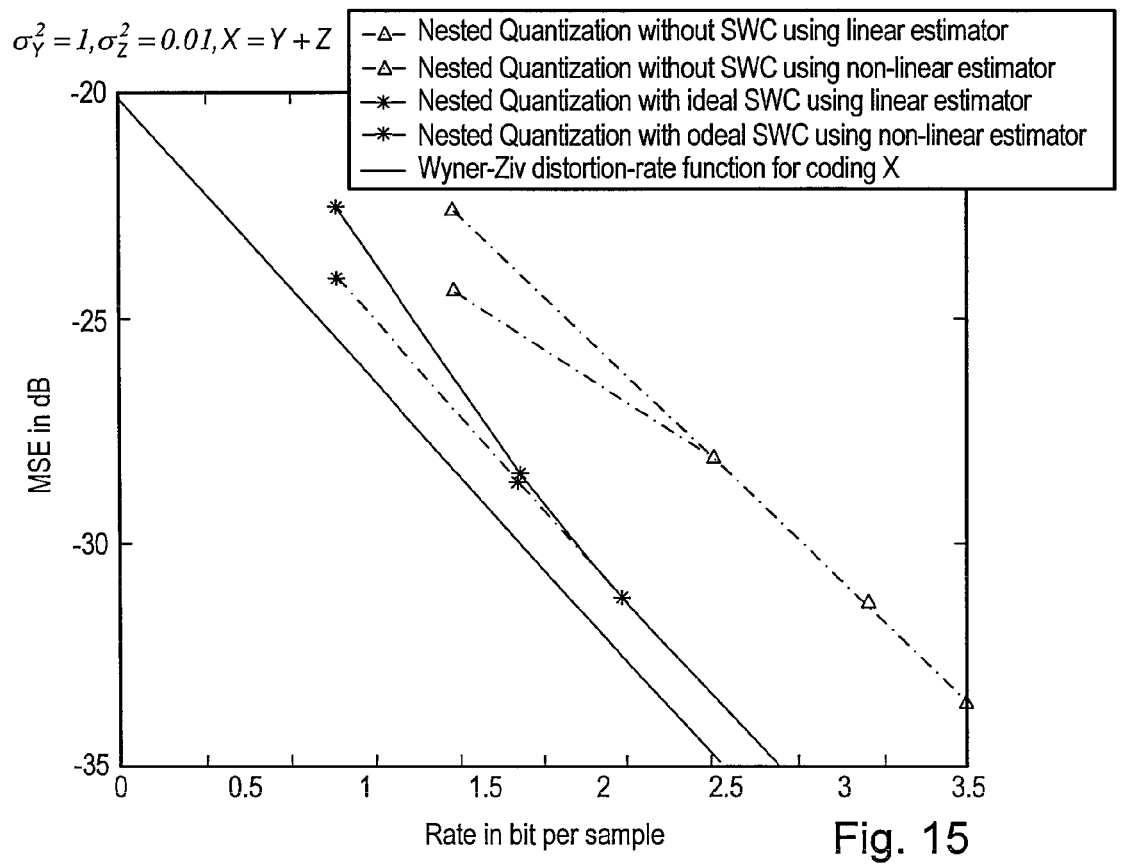
FIG. 15 shows the improvement gained by using the optimal (non-linear) estimator at low rates, for n=2 and $\sigma_Z^2=0.01$.

FIG. 15 shows the improvement gained by using the optimal (non-linear) estimator at low rates, for n=2 and $\sigma_Z^2=0.01$.

B. Code Design of LDPC Codes.

Let J ($0 \leq J \leq N-1$) denote the index of the coset leader v. The index J is coded using Slepian-Wolf codes with Y as the side information. Instead of coding J as a whole, we code J bit-by-bit using multi-layer Slepian-Wolf coding as follows.

Assume $J=(B_m B_{m-1} \ldots B_2 B_1)_2$, where $B_m$ is the most significant bit (MSB) of J, and $B_1$ is the least significant bit (LSB). A block of the indices may be collected. The first $B_1$ (i.e., a block of the first bits from the block of indices) is encoded at rate $R_1=H(B_1|Y)$ using a Slepian-Wolf code designed under the assumption that the corresponding decoder has only Y as side information; then the second bit $B_2$ (i.e., a block of the second bits from the block of indices) is encoded at rate $R_2=H(B_2|Y,B_1)$ using a Slepian-Wolf code designed under the assumption that the corresponding decoder has only Y and $B_1$ as side information; ...; finally, the last bit $B_m$ (i.e., a block of the last bits from the block of indices) is encoded at rate $R_m=H(B_m|Y, B_1, B_2, \ldots, B_{m-1})$ with a Slepian-Wolf code designed under the assumption that the corresponding decoder has side information $\{Y, B_1, B_2, \ldots, B_{m-1}\}$. Hence the total rate of the Slepian-Wolf code is $H(J|Y)=H(v|Y)$.

Practically, strong channel codes such as LDPC or Turbo codes are applied as Slepian-Wolf codes. The first step in designing is to determine the rate of the channel code to be used. Since $R_n$ is equivalent to the amount of syndromes to be sent per bit, the channel code rate is $1-R_n$. Thus the optimum rate at the $n^{th}$ layer that achieves Slepian-Wolf bound is $1-H(B_n|Y, B_1, \ldots, B_{n-1})$. This multi-layer Slepian-Wolf coding scheme is shown in FIG. 16.

Figure 16:
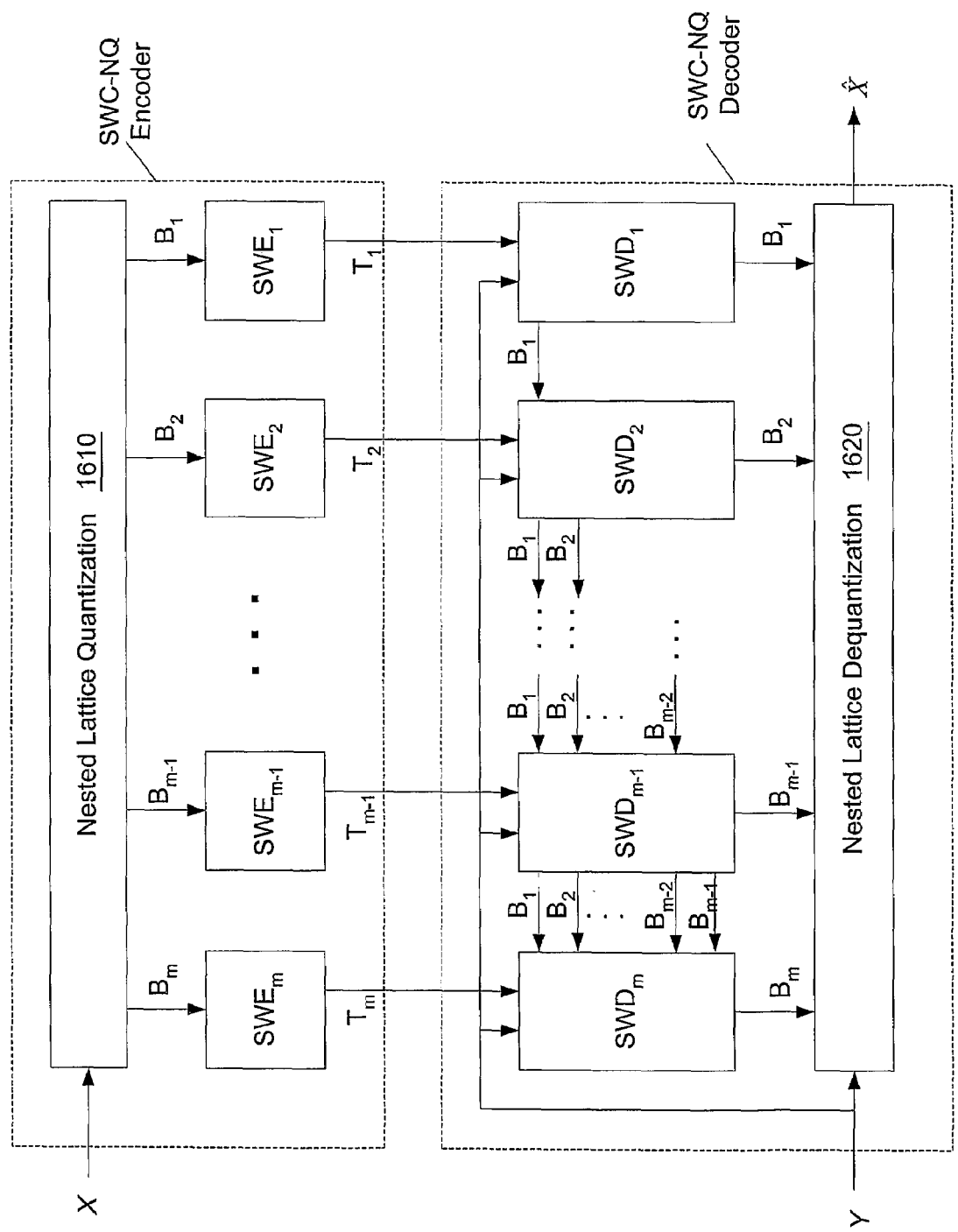
FIG. 16 illustrates one embodiment of a multi-layer Slepian Wolf coding scheme.

As shown in FIG. 16, one embodiment of an SWC-NQ encoder includes a nested lattice quantization unit 1610 and a set of Slepian-Wolf encoder $SWE_1, SWE_2, \ldots, SWE_m$. The nested quantization unit 1610 operates on a value of the input source X and generates the bits $B_1, B_2, \ldots, B_{m-1}, B_m$ of the index J as described above. The nested quantization unit does this operation repeatedly on successive values of the input source, and thus, generates a stream of indices. Each of the Slepian-Wolf encoders $SWE_n$, n=1, 2, ..., m, collects a block of the $B_n$ bits from the stream of indices and encodes this block, thereby generating an encoded block $T_n$. The encoded blocks $T_1, T_2, \ldots, T_m$ are sent to an SWC-NQ decoder.

As shown, one embodiment of the SWC-NQ decoder includes a set of Slepian-Wolf decoders $SWD_1, SWD_2, \ldots, SWD_m$ and a nested quantization decoder 1620. Each Slepian-Wolf decoder $SWD_n$, n=1, 2, ..., m, decodes the compressed block $T_n$ to recover the corresponding block of $B_n$ bits. As noted above, decoder $SWD_n$ uses side information $\{Y, B_1, B_2, \ldots, B_{n-1}\}$. The nested quantization decoder 1620 operates on the blocks generated by the decoders using a block of the Y values, as described above, to compute a block of estimated values of the source.

C. Simulation Results.

Figure 17:
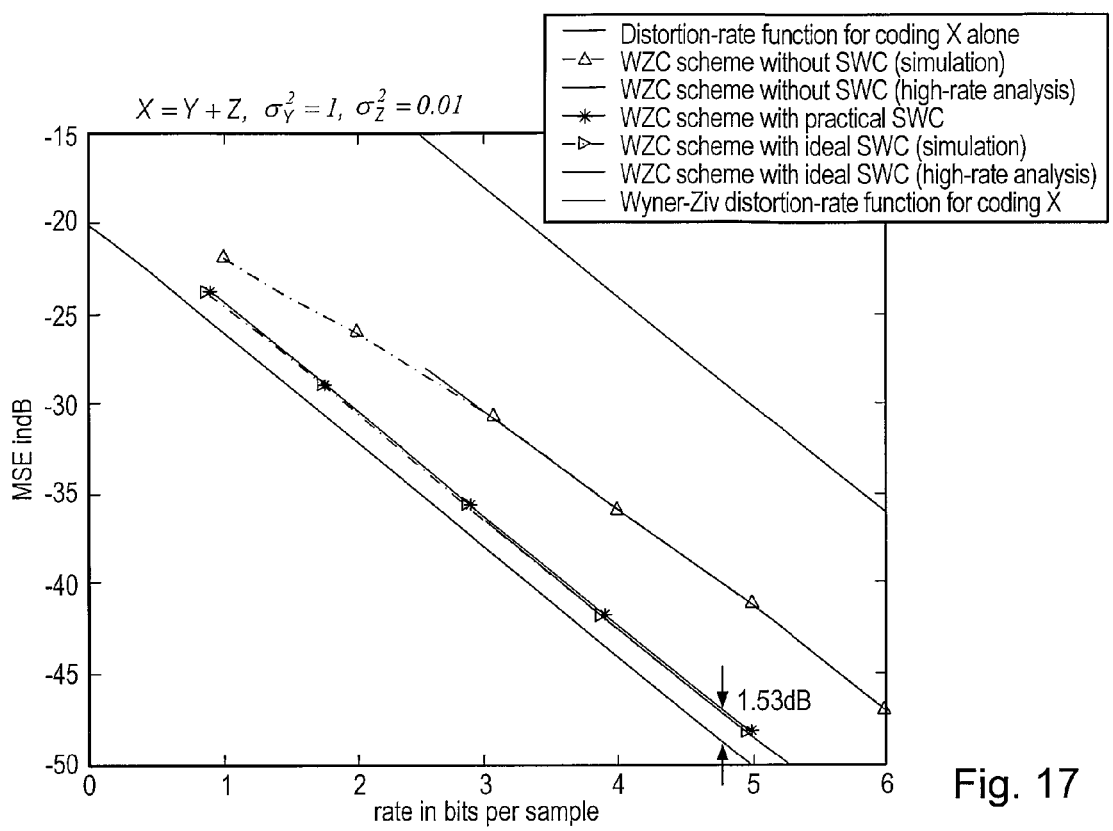
FIG. 17 shows results based on 1-D nested lattice quantization both with and without Slepian Wolf coding (SWC)

We carry out 1-D nested lattice quantizer design for different sources with $10^6$ samples of X in each case. For $\sigma_Y^2=1$ and $\sigma_Z^2=0.01$, FIG. 17 shows results with nested lattice quantization alone and SWC-NQ. The former exhibits a 3.95-9.60 dB gap from $D_{WZ}(R)$ for R in the range from 1.0 to 7.0 bits/sample (b/s), which agree with the high rate lower bound of Theorem 1. At high rate, we observe that the gap between our results with ideal SWC (i.e., rate computed as H(J|Y) in the simulation) and $D_{WZ}(R)$ is indeed 1.53 dB. With practical SWC based on irregular LDPC codes of length $10^6$ bits, this gap is 1.66-1.80 dB for R in the range from 0.93 to 5.00 b/s.

Figure 18:
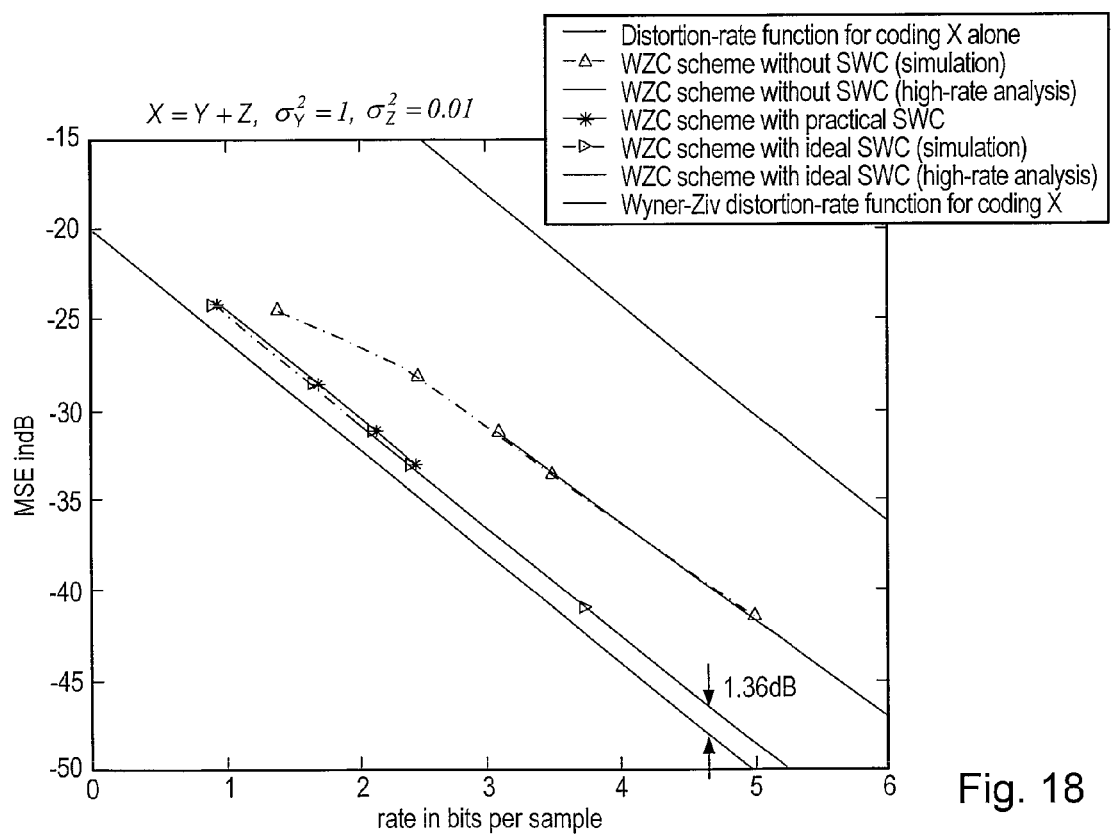
FIG. 18 shows results based on 2-D nested lattice quantization both with and without Slepian Wolf coding (SWC).

For 2-D nested lattice quantization, we use the $A_2$ hexagonal lattices again with $\sigma_Y^2=1$ and $\sigma_Z^2=0.01$. FIG. 18 shows results with nested lattice quantization alone and SWC-NQ. At high rate, the former case exhibits a 4.06-8.48 dB gap from $D_{WZ}(R)$ for R=1.40-5.00 b/s, again in agreement with the high rate lower bound of Theorem 1. We observe that the gap between our results with ideal SWC (measured in the simulation) and $D_{WZ}(R)$ is 1.36 dB. With practical SWC based on irregular LDPC codes (of length $10^6$ bits), this gap is 1.67-1.72 dB for R=0.95-2.45 b/s.

We thus see that using optimal estimation as described herein, our simulation results with either 1-D or 2-D nested quantization (and practical Slepian-Wolf coding) are almost a constant gap away from the Wyner-Ziv limit for a wide range of rates.

In this paper, the high-rate R-D performance of the nested lattice quantization for the Wyner-Ziv coding is analyzed, with low dimensional lattice codes. The performance is away from the Wyner-Ziv bound with each specific lattice code, and exhibits an increasing gap from the Wyner-Ziv bound as the rate increases. The reason for the increase of the gap mainly comes from the fact that the granular component of the distortion is an increasing function of the rate. Therefore the Slepian-Wolf coding, as a second-layer binning scheme, is applied to the quantization indices for further compression. This Slepian-Wolf coded nested lattice quantization (SWC-NQ) performs at a constant gap from the Wyner-Ziv bound at high rates, and the constant gap is the same as the one from ECVQ (entropy coded vector quantization) to the ideal R-D function of source coding without the side information. Moreover, a non-linear estimator for the decoder is introduced, and proved to be optimal in the sense of the MSE measurement. This non-linear estimator helps at low-rates, and degrades to the linear one which is assumed in the theoretical analyses in this paper. Simulation results for 1-D and 2-D cases are in agreement with the theoretical analysis.

Proof of Lower Bound (49).

Proof to establish the lower bound for the performance of quadratic Gaussian SWC-NQ.

1) Rate Computation:

The rate for SWC-NQ is:

$$R = \frac{1}{n}H(v\mid Y). \tag{69}$$

Since at high rate, $$\begin{aligned}P(v\mid Y) &= \sum_{j=-\infty}^{\infty}\int_{x\in R_j(v)} f_{X\mid Y}(x)\,dx \\ &= \sum_{j=-\infty}^{\infty}\int_{x\in R_0(v)} f_{X\mid Y}(x+c_j(0))\,dx \\ &\approx \sum_{j=-\infty}^{\infty} F_{X\mid Y}(v+c_j(0))V_1 \\ &\equiv g(v)V_1,\end{aligned} \tag{70}$$

where $g(x) \equiv \sum_{j=-\infty}^{\infty} f_{X\mid Y}(x+c_j(0))$, and $X\mid Y \sim N(0, \sigma_{X\mid Y}^2)$.

Then the achievable rate of SWC-NQ is $$\begin{aligned}nR = H(v\mid Y) &= -\sum_{v\in\Lambda_1/\Lambda_2} P(v\mid Y)\log_2[P(v\mid Y)] \\ &\approx -\sum_{v\in\Lambda_1/\Lambda_2} P(v\mid Y)\log_2[g(v)V_1] \\ &= -\sum_{v\in\Lambda_1/\Lambda_2}\sum_{j=-\infty}^{\infty}\int_{x\in R_0(v)} f_{X\mid Y}(x+c_j(0))\,dx\log_2 g(v) - \log_2 V_1 \\ &\approx -\sum_{j=-\infty}^{\infty}\sum_{v\in\Lambda_1/\Lambda_2}\int_{x\in R_0(v)} f_{X\mid Y}(x+c_j(0))\log_2 g(x)\,dx - \log_2 V_1 \\ &\stackrel{(a)}{=} -\int_{x\in R^n} f_{X\mid Y}(x)\log_2 g(x)\,dx - \log_2 V_1\end{aligned}$$

where (a) comes from the periodic property of $g(\cdot)$, i.e., $g(x-l)=g(x), \forall l\in\Lambda_2$. Thus the achievable rate of SWC-NQ is $$nR = H(v\mid Y) = h'(X,\Lambda_2) + \log_2 \sigma_{X\mid Y}^n - \log_2 V_1. \tag{71}$$

2) Distortion Computation: From Theorem 4.1, the average distortion of nested lattice quantization over all realizations of (X,Y) is $$\begin{aligned}D_n &= G(\Lambda_1)V_1^{2/n} + \frac{1}{n}E_Z[\|Q_{\Lambda_2}(z)\|^2] \\ &\geq G(\Lambda_1)V_1^{2/n} + \frac{1}{n}\sum_{j=1}^{\infty}((2j-1)\gamma_n V_2^{2/n})u\left(\frac{j^2 V_2^{2/n}\Gamma\left(\frac{n}{2}+1\right)^{2/n}}{2\pi\sigma_Z^2}\right).\end{aligned} \tag{72}$$

Because SWC is lossless, the distortion of SWC-NQ is also $D_n$. Combining $D_n$ and R through $V_1$, we obtain the R-D performance of SWC-NQ with a pair of n-D nested lattices $(\Lambda_1,\Lambda_2)$ as $$D_n(R) \geq G(\Lambda_1)2^{(2/n)h'(X,\Lambda_2)}\sigma_{X\mid Y}^2 2^{-2R} + \tag{73}$$

$$\frac{1}{n}\sum_{j=1}^{\infty}((2j-1)\gamma_n V_2^{2/n})u\left(\frac{j^2 V_2^{2/n}\Gamma\left(\frac{n}{2}+1\right)^{2/n}}{2\pi\sigma_Z^2}\right).$$

Proof of Lemma 5.1

This proof closely follows the remark 3) of [1] page 3, with some slight modifications.

$$Let\ \delta \equiv \min_{w\neq\hat{x}} d(w,\hat{x})_{\mid Y} > 0.$$

Here $\delta$ is actually the minimum of the distance between two lattice points of $\Lambda_2$. Thus if $(x,\hat{x})\in S_1$, $$\lambda \equiv Pr\{W\neq\hat{x}\} \leq E[d(W,\hat{x})]/\delta \stackrel{(a)}{\leq} (E[d(W,X)] + E[d(X,\hat{x})])/\delta \tag{74}$$

where (a) comes from the triangle inequality. From Theorem 1, $$D = E[d(X,\hat{X})] = MSE_g + MSE_{ol},$$

where $MSE_g = E[d(W,X)]$ is the granular component and $MSE_{ol}$ is the overload component, then $$\lambda \leq 2D/\delta. \tag{75}$$

Now since $\hat{X}$ is a function of V, Y, Fano's inequality [30], [31] implies that $$H(W\mid V,Y) \leq -\lambda\log\lambda - (1-\lambda)\log(1-\lambda) + \lambda\log(|W|) \equiv \varepsilon(\lambda), \tag{76}$$

so that $$H(V\mid Y) \geq I(W;V\mid Y) = \tag{77}$$
$$H(W\mid Y) - H(W\mid V,Y) \geq H(W\mid Y) - \varepsilon\left(\frac{2D}{\delta}\right).$$

Meanwhile, from data processing rule, we have $H(V\mid Y) \leq H(W\mid Y)$. At high rate, $D\to 0$, and $$\varepsilon\left(\frac{2D}{\delta}\right) \to 0.$$

Thus at high rate, $H(V\mid Y) \approx H(W\mid Y)$.

This claim is also verified intuitively by FIG. 13, where the slant part of each curve which corresponds to the R-D performance with a fixed $V_2$, or $\delta$, approximately maintains a constant slope.

It is noted that any or all of the method embodiments described herein may be implemented in terms of program instructions executable by one or more processors. The program instructions (or subsets thereof) may be stored and/or transmitted on any of various carrier media. Furthermore, the data generated by any or all of the method embodiments described herein may be stored and/or transmitted on any of various carrier media.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for generating compressed output data, the method comprising:
 a computer receiving input data from an information source;
 the computer applying nested lattice quantization to the input data in order to generate intermediate data, wherein the nested lattice quantization is based on a fine lattice and a coarse sublattice of the fine lattice, wherein a cell volume of the coarse sublattice minimizes an average error in estimation of the input data at a decoder given a fixed nesting ratio between the coarse sublattice and the fine lattice, wherein the decoder is configured to use side information that is correlated with the input data to perform said estimation; and
 the computer encoding the intermediate data using an asymmetric Slepian-Wolf encoder in order to generate compressed output data representing the input data; and
 storing the compressed output data.

2. The method of claim 1, wherein the input data includes vectors in an n-dimensional space, wherein n is greater than one.

3. The method of claim 2, wherein n equals two.

4. The method of claim 2, wherein said applying nested lattice quantization to the input data includes:
 quantizing values of the input data with respect to the fine lattice to determine corresponding points of the fine lattice; and
 determining indices for cosets of the coarse sublattice, the cosets corresponding respectively to the fine lattice points, wherein the intermediate data includes said indices.

5. The method of claim 2, wherein the asymmetric Slepian-Wolf encoder includes a plurality of asymmetric Slepian-Wolf subencoders, wherein each of the subencoders operates on a respective bit plane of the intermediate data.

6. The method of claim 5, wherein the asymmetric Slepian-Wolf subencoders operate in parallel on the respective bit planes of the intermediate data.

7. The method of claim 2 further comprising transferring the compressed output data to the decoder.

8. The method of claim 1, wherein the fine lattice is a two-dimensional hexagonal lattice.

9. The method of claim 1, wherein the asymmetric Slepian-Wolf encoder achieves a compression rate that approaches the limit for Slepian-Wolf coding.

10. The method of claim 1, wherein the asymmetric Slepian-Wolf encoder is based on one or more turbo codes.

11. A system, comprising:
 a quantization unit configured to receive signal data and to perform nested lattice quantization on the signal data in order to generate intermediate data, wherein the nested lattice quantization is based on a fine lattice and a coarse sublattice of the fine lattice, wherein a cell volume of the coarse sublattice minimizes an average error in estimation of the input data at a decoder given a fixed nesting ratio between the coarse sublattice and the fine lattice, wherein the decoder is configured to use side information that is correlated with the input data to perform said estimation; and
 an encoding unit coupled to the quantization unit and configured to encode the intermediate data using a set of one or more asymmetric Slepian-Wolf encoders in order to generate compressed output data representing the signal data.

12. The system of claim 11, wherein the fine lattice is a lattice in an n-dimensional space, wherein n is greater than one.

13. The system of claim 12, wherein the asymmetric Slepian-Wolf encoders are configured to operate in parallel on respective bit planes of the intermediate data.

14. A system for generating compressed output data, the system comprising:
 one or more processors; and
 a memory that stores at least program instructions, wherein the program instructions are executable by the one or more processors to:
  perform a nested lattice quantization on received input data in order to generate intermediate data, wherein the nested lattice quantization is based on a fine lattice and a coarse sublattice of the fine lattice, wherein a cell volume of the coarse sublattice is selected to minimize an average error in estimation of the input data at a decoder given a fixed nesting ratio between the coarse sublattice and the fine lattice, wherein the decoder is configured to use side information that is correlated with the input data to perform said estimation; and
  operate on the intermediate data using a set of one or more asymmetric Slepian-Wolf encoders in order to generate compressed output data.

15. The system of claim 14, wherein the fine lattice is a lattice in an n-dimensional space, wherein n is greater than one.

16. The system of claim 15, wherein the one or more asymmetric Slepian-Wolf encoders include a plurality of asymmetric Slepian-Wolf encoders, wherein the program instructions are executable by the one or more processors to operate on bit planes of the intermediate data using respective ones of the encoders.

17. The system of claim 14, wherein at least one of the asymmetric Slepian-Wolf encoders is based on a turbo code.

18. The system of claim 14, wherein each of the asymmetric Slepian-Wolf encoders is configured to achieve a compression rate that approaches the limit for Slepian-Wolf coding for a corresponding one of the bit planes of the intermediate data.

19. The system of claim 14, wherein the program instructions are executable by the one or more processors to transmit the compressed output data to the decoder.

20. A computer-readable medium having stored thereon, computer-executable instructions that, if executed by a computer system cause the computer system to perform a method comprising:
 quantizing received input data using nested lattice quantization in order to generate intermediate data, wherein the nested lattice quantization is based on a fine lattice and a coarse sublattice of the fine lattice, wherein a cell volume of the coarse sublattice minimizes an average error in estimation of the input data at a decoder given a fixed nesting ratio between the coarse sublattice and the fine lattice, wherein the decoder is configured to use side information that is correlated with the input data to perform said estimation;
 encoding the intermediate data using a set of one or more asymmetric Slepian-Wolf encoders in order to generate compressed output data; and
 storing the compressed output data in a memory.

21. The medium of claim 20, wherein the fine lattice is a lattice in an n-dimensional space, wherein n is greater than one.

22. The medium of claim 21, wherein the asymmetric Slepian-Wolf encoders operate in parallel on respective bit planes of the intermediate data.

23. The medium of claim 21, wherein at least one of the asymmetric Slepian-Wolf encoders is based on a turbo code.

24. The medium of claim 21, wherein the method further comprises:

transferring the compressed output data to the decoder.

25. A system, comprising:

a first means for applying nested lattice quantization to received input data in order to generate intermediate data, wherein the nested lattice quantization is based on a fine lattice and a coarse sublattice of the fine lattice, wherein a cell volume of the coarse sublattice has been selected to minimize an average error in estimation of the input data at a decoder given a fixed nesting ratio between the coarse sublattice and the fine lattice; and a second means for encoding the intermediate data in order to generate compressed output data.

* * * * *

UNITED STATES PATENT AND TRADEMARK OFFICE
CERTIFICATE OF CORRECTION

PATENT NO. : 7,602,317 B2
APPLICATION NO. : 11/868885
DATED : October 13, 2009
INVENTOR(S) : Zhixin Liu et al.

It is certified that error appears in the above-identified patent and that said Letters Patent is hereby corrected as shown below:

Title Page;

Page 1, (Item 76), Inventors, line 5, Change "1315," to --1513,--.

Column 1, line 9, Change "2005" to --2005,--.

Column 1, line 15, Change "Slevian" to --Slepian--.

Column 4, line 48, Change "decoder." to --decoder;--.

Column 6, line 37, Change "Formey," to --Forney,--.

Column 7, line 1, Change "Formey" to --Forney--.

Column 13, line 35 (Approx.), Change " $Z \rightarrow N(0, \sigma_z^2)$, " to -- $Z \sim N(0, \sigma_z^2)$, --.

Column 16, line 33, Change "$g_n,\}$" to --$g_n\}$--.

Column 16, line 34, Change "A" to --$\Lambda$--.

Column 17, line 43, Change " $\Lambda_1/\Lambda_2 \equiv \{\Lambda_1 \cap K_2\}$ " to -- $\Lambda_1/\Lambda_2 \equiv \{\Lambda_1 \mathbin{I} K_2\}$ --.

Column 18, line 2, Change " $U_{j=-\infty}^{\infty} R_j(v)$. " to -- $Y_{j=-\infty}^{\infty} R_j(v)$. --.

Column 18, line 42, Change "al's" to --al.'s--.

Column 19, line 12, Change "W" to --w--.

Signed and Sealed this

Tenth Day of August, 2010

David J. Kappos
*Director of the United States Patent and Trademark Office*

CERTIFICATE OF CORRECTION (continued)
U.S. Pat. No. 7,602,317 B2

Column 19, line 43 (Approx.), Change "$\sum_{v \in \Lambda_1 \Lambda_2}$" to -- $\sum_{i \in \Lambda_1/\Lambda_2}$ --.

Column 23, line 10 (Approx.), Change "$\sum_{j=1}^{x}$" to -- $\sum_{j=1}^{\infty}$ --.

Column 24, line 55, After "$s = V_2^{2/n}, t = \frac{\hat{r}\Gamma\left(\frac{n}{2}+1\right)^{2/n}}{2\pi\sigma_{\hat{z}}^2} s,$" to -- and $A = \Gamma(\frac{4}{2}+1)^{2/n}$. --.

Column 25, line 54 (Approx.), After "$\frac{1}{2}\sum_{j=1}^{\infty}$" to -- $\frac{1}{n}\sum_{j=1}^{\infty}$ --.

Column 29, line 17 (Approx.), Change "$D_n^*(R) = G_n 2^{(2/n)h(X|Y)} 2^{-2R}$." to -- $D_n^*(R) = 2\pi e G_n \sigma_{X|Y}^2 2^{-2R}$. --.